United States Patent [19]
Fujiwara et al.

[11] Patent Number: 5,999,444
[45] Date of Patent: Dec. 7, 1999

[54] NONVOLATILE SEMICONDUCTOR MEMORY DEVICE AND WRITING AND ERASING METHOD OF THE SAME

[75] Inventors: Ichiro Fujiwara, Kanagawa; Yutaka Hayashi, Ibaraki, both of Japan

[73] Assignee: Sony Corporation, Japan

[21] Appl. No.: 09/144,199

[22] Filed: Aug. 31, 1998

[30] Foreign Application Priority Data

| Sep. 2, 1997 | [JP] | Japan | PO9-236698 |
| Oct. 1, 1997 | [JP] | Japan | PO9-269067 |
| Dec. 5, 1997 | [JP] | Japan | PO9-336191 |
| May 8, 1998 | [JP] | Japan | PO10-126423 |

[51] Int. Cl.$^6$ .................................................. G11C 11/34
[52] U.S. Cl. ............................. 365/185.02; 365/185.18; 365/185.23
[58] Field of Search ...................... 365/185.02, 185.18, 365/185.23

[56] References Cited

U.S. PATENT DOCUMENTS

| 4,903,236 | 2/1990 | Nakayama et al. | 365/185 |
| 5,654,920 | 8/1997 | Watsuji et al. | 365/185.27 |
| 5,828,600 | 10/1998 | Kato et al. | 365/185.11 |

*Primary Examiner*—David Nelms
*Assistant Examiner*—VanThu Nguyen
*Attorney, Agent, or Firm*—Rader, Fishman & Grauer; Ronald P. Kananen

[57] ABSTRACT

A nonvolatile semiconductor memory device and writing method of the same having a planarly dispersed charge storing means, which improve the programming disturbance characteristic, wherein gate electrodes of a plurality of memory elements are connected to a plurality of word lines, source regions or drain regions are connected with a common line (for example, a bit line or a source line) which crosses the word lines in an electrically insulated state, and the memory device includes a write inhibit voltage supplying means for supplying a source region and/or drain region of a memory element connected to the selected word line with a reverse bias voltage placing the source/drain region in a reverse bias state to the channel forming region via the common line and a non-selected word line biasing means for supplying a non-selected word line with a voltage in the polarity placing the non-selected word, line in a reverse bias state to the channel forming region.

52 Claims, 24 Drawing Sheets

GATE VOLTAGE DEPENDENCY OF CHANNEL VERTICAL DIRECTION ELECTRIC FIELD INTENSITY Ey

ONE DIMENSIONAL ELECTRIC FIELD Ey DISTRIBUTION AS A FUNCTION OF GATE VOLTAGE.

Ey : ELECTRIC FIELD PERPENDICULAR TO THE CHANNEL

ESTIMATION OF MINIMUM AREA OF MEMORY CELL (Mm,n)

$$S = 2\sqrt{2}F \times 2F \fallingdotseq 5.6F^2$$

FINE NOR TYPE CELL

FIG. 23

INHIBIT CHARACTERISTIC JUDGEMENT CONDITIONS OF CELL A AND CELL B

| | CELL A | CELL B |
|---|---|---|
| GATE VOLTAGE | Vg=9,10,11,12V | Vg=0V |
| SOURCE VOLTAGE Vs / DRAIN VOLTAGE Vd | Vs=Vd=0~10V | Vs=Vd=0~12V |
| CONDITION SCHEME | Vg(9,10,11,12V)<br>Vs=Vd=parameter | Vg(1,2,3,4,5,6V)<br>Vs=Vd=parameter |
| JUDGEMENT CONDITIONS | WHEN APPLYING PROGRAM VOLTAGE Vg AND PROGRAM PULSE OF 0.1msec TO 10 msec, ONE PULSE IS APPLIED TO CELL A, THEN, OBTAINING TWO ORDER MARGIN, AND THUS, Vth DEVIATION ≦ 0.2V | WHEN APPLYING PROGRAM PULSE OF 0.1msec TO 10 msec, CELL B IS APPLIED WITH PULSES CORRESPONDING TO THE NUMBER OF WORD LINES WHITHIN ONE STRING, HERE, SUPPOSED THAT ONE STRING IS 100 WORD LINES, OBTAINING ONE ORDER MARGIN, Vth DEVIATION ≦ 0.2V. |

NONVOLATILE SEMICONDUCTOR MEMORY DEVICE AND WRITING AND ERASING METHOD OF THE SAME

BACKGROUND OF THE INVENTION

1. Field of the Invention

The present invention relates to a nonvolatile semiconductor memory device and a writing and erasing method for the same.

Particularly, the present invention relates to a nonvolatile semiconductor memory device having a planarly dispersed charge storing means (for example, charge traps in a nitride film in a metal (generally, conductive gate)-oxide-nitride-oxide semiconductor (MONOS) element or metal (generally, conductive gate)-nitride-oxide semiconductor (MNOS) element), charge traps at a boundary region between an oxide film and the nitride film, small particle size semiconductors or conductors insulated from each other, etc.) in an internal portion of a gate insulating film between a channel forming region and gate electrode of a memory transistor which has as a basic operation to electrically inject a charge (electrons or holes) to the charge storing means to store or to extract charge from the charge storming means, and a writing and erasing method for the same.

More particularly, the present invention relates to application of a write inhibit voltage for effectively preventing erroneous writing or erroneous erasing in a non-selected memory transistor at the time of writing data to a selected memory transistor by supplying a predetermined bias voltage to each of a source, drain, and gate of the non-selected memory transistor.

2. Description of the Related Art

In today's sophisticated information society or high speed, wide area network society, there is a great need for large capacity file memories and audio-video use memories. At the present, as a large capacity memory system for storing more than 1 gigabyte (GB) of data, use is being made of disk memory systems using a disk such as a hard disk or optical disk as a recording medium. There has been lively research in recent years on replacing this big market by nonvolatile semiconductor memories.

While nonvolatile semiconductor memories dovetail with the trends of reduction of the size and reduction of the weight of the hardware, the storage capacity is still insufficient. A flash memory having over a 1 gigabit (Gb) capacity has not yet been realized. Further, nonvolatile semiconductor memories, in addition to the insufficient storage capacity, suffer from an insufficient reduction of the bit cost compared with a disk memory. Accordingly, it is important to increase the degree of integration of nonvolatile semiconductor memories to overcome these disadvantages.

There are generally the following two ways to raise the bit capacity of a nonvolatile semiconductor memory. The first method is to use a finer design rule in VLSI technology or an advanced circuitry of the memory cell or device structure to reduce the area occupied by the memory cell array and peripheral circuits. The second method is to make the memory transistors constituting the memory cells multi-valued so as to make a single transistor store a plurality of bits and thereby substantially raise the storage capacity with the same degree of integration. Both of the first and second methods are being studied in depth at the present time.

In the first method, miniaturization is being achieved by the so-called scaling rule. There are however various inherent problems in scaling to realize a more than 1 Gb large capacity semiconductor memory by a planarly contiguous floating gate (FG) type flash memory, particularly the difficulty of lowering of the operating voltage due to the fact that the thickness of the tunnel oxide film is not scaled (for example, see Nikkei Microdevices, January and February 1997). Namely, in an FG type flash memory, since the holding of the charge at the floating gate depends upon only the thickness of the tunnel oxide film, theoretical analysis of the back tunneling current from the floating gate shows that the thickness of the tunnel oxide film is physically limited to about 6 nm. However, a high electric field of about 10 MV/cm is used for writing the data in the current FG type flash memory at the stage before this physical limit is reached, therefore it has been pointed out that the stress leakage of the tunnel oxide film increases along with an increase of the number of rewrites of the data and that this stress leakage determines the effective limit of thickness of the tunnel oxide film. Due to the limit on the film thickness due to the increase of the stress leakage current, it is difficult to reduce the thickness of the tunnel oxide film to the 6 nm of the theoretical limit. It is thought that the realistic limit of thickness of the tunnel oxide film is 8 nm. For low voltage writing, the tunnel oxide film must be made thinner, but the limit of reduction of the thickness of the tunnel oxide film contradicts the scaling rule of lowering the voltage, therefore scaling of the write voltage has become difficult. As a result, the reduction of the area etc. of the peripheral circuits is becoming very difficult.

On the other hand, in the MONOS type nonvolatile memory, the carrier traps in the nitride film ($Si_xN_y$ film; $0<x<1$, $0<y<1$) which mainly serves to hold the charge are discrete and spread out spatially (in the planar direction and thickness direction), therefore the data holding characteristic depends upon not only the thickness of the tunnel oxide film, but also the energy-wise and spatial distribution of the charges trapped by the carrier traps in the $Si_xN_y$ film. When the charge storing means is made spatially discrete in this way, even when part of the tunnel oxide film is missing, it will have no great influence upon the retention (charge holding) characteristic of the overall memory element. For this reason, the problem of reduction of the thickness of the tunnel oxide film is not as serious as with the FG type, therefore the scaling property of the tunnel oxide film in a miniaturized ultra-fine memory transistor is better in the MONOS type than the FG type.

To reduce the bit cost and increase the density of integration for such a MONOS type or MNOS type nonvolatile memory and thereby realize a large scale nonvolatile memory, it is necessary to realize a one-transistor type cell structure. The conventional MONOS and other types of nonvolatile memories with thin tunnel oxide, however, have mainly been of the two-transistor type where a selection transistor is connected to the memory transistor. The establishment of a cell technique for realizing a one-transistor cell has been a key theme in the past. For establishment of this one-transistor cell technique, it is important not only to optimize the device structure, focusing on the gate insulating film containing the charge storing means, and improve the reliability, but also improve the disturb characteristic. However, there have been only a few reports on the read disturb characteristics of memory cells, in particular almost no reports on the programming disturb characteristic, since two-transistor cells have been studied up to now.

SUMMARY OF THE INVENTION

An object of the present invention is to provide a new method of setting a bias of a memory cell connected to a non-selected word line for improving the programming disturb characteristic in a MONOS type or other nonvolatile semiconductor memory device, thought to be better in scaling property of the tunnel insulating film than the FG type, which basically operates by storing a charge in planarly discrete carrier traps (one example of "charge storing means") and to provide a nonvolatile semiconductor memory device having a configuration suited for this.

Another object of the present invention is to provide a data writing and erasing method in the above nonvolatile semiconductor memory device.

According to the present invention, there is provided a nonvolatile semiconductor memory device having a plurality of memory elements provided in the surface of a substrate, a plurality of word lines for driving the memory elements, and a plurality of bit lines, wherein each of the plurality of memory elements has a semiconductor channel forming region provided in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film containing a tunnel insulating film provided on the channel forming region, a conductive gate electrode provided in the gate insulating film, and a charge storing means provided on the tunnel insulating film and in the gate insulating film and made planarly discrete in the semiconductor substrate; gate electrodes of the plurality of memory elements are respectively connected to the plurality of word lines; the source region or the drain region of each of the memory elements is connected to a common line in the bit direction electrically insulated from each of the plurality of word lines and crossing the word lines; and further including: a write inhibit voltage supplying means for applying a reverse bias voltage via the common line to the source region and/or drain region of a memory element having a gate electrode connected to the word line selected when writing data, the reverse bias voltage being a voltage by which the source region and/or drain region becomes the reverse bias with respect to the channel forming region; and a non-selected word line biasing means for applying a voltage to the non-selected word line in the polarity becoming the reverse bias to the channel forming region when writing data.

Further, according to the present invention, there is provided a writing method in a nonvolatile semiconductor memory device having the above configuration, comprising the following steps, that is, (a) a step of supplying the non-selected word line with a voltage in the polarity becoming a reverse bias to the channel forming region at the time of writing, for the reduction of write and/or erase inhibit disturb with respect to a non-selected memory element and (b) a step of supplying the source region and/or drain region of a memory element having a gate electrode connected to the word line selected at the time of writing among a plurality of word lines for commonly connecting the gate electrodes in a word direction with a bias voltage (for write and/or erase inhibit) in the polarity becoming a reverse bias with respect to the channel forming region via the common line of the bit direction crossing the word lines in an electrically insulated state and connecting to the source region or drain region.

In this invention, 'write and/or erase inhibit disturb' is defined as the disturbance given to a memory element whose conductive gate is connected to an un-selected word line by a write and/or erase inhibit voltage applied to the source and/or drain region of the memory element.

Preferably, the voltage to the non-selected word line and the reverse bias voltage to the source region and/or drain region are supplied in that order.

The nonvolatile semiconductor memory device of the present invention is preferred not only for NOR type device but also for an AND type device including ones in which bit lines or source lines are arranged in a layered structure and further is preferred for the following cases:

(1) The inhibit voltage supplying means biases the source and/or drain region to the write inhibit voltage.

(2) The non-selected word line biasing means biases the voltage of the non-selected word line with respect to the channel forming region to less than an upper limit of the gate voltage in the absolute value with which a memory element connected to the non-selected word line will not be erroneously written and/or erroneously erased.

(3) The write inhibit voltage supplying means supplies the same reverse bias voltage to both of the source region and the drain region.

(4) An absolute value of the reverse bias voltage to be supplied at least to the drain region is higher than the absolute value of the voltage supplied by the non-selected word line biasing means. For example, the absolute value of the reverse bias voltage common to the source region and the drain region is higher than the absolute value of the voltage supplied by the non-selected word line biasing means.

(5) In the memory element, when the reverse bias voltage is supplied to the source region and the drain region in a state where the gate electrode is applied by the same voltage as that of the channel forming region, the depletion layers extend from the source region and drain region to the channel forming region where they merge. For example, viewed in terms of the gate length of the memory element, the gate length of the memory element of the present invention is shorter than the gate length at which, when the reverse bias voltage is supplied in a state where the gate electrode is applied by the same voltage as that of the channel forming region, the depletion layers extend from the source region and drain region to the channel forming region and where they just merge.

(6) The gate length of the memory element is 0.2 $\mu$m or less.

Note that, for example, in an AND type device, each of the bit lines and the source lines to which the drains or sources of the plurality of memory elements are connected is constituted by a main bit line and sub-bit line and a main source line and sub-source line. The device has for example a layered interconnection structure.

In the nonvolatile semiconductor memory device of the present invention and the writing and erasing method of the same described above, since for example the non-selected word line biasing means supplies the gate of a non-selected memory element connected to a non-selected word line with voltage in the polarity becoming a reverse bias for the channel forming region (for example, the surface of the substrate, the well, or SOI layer or other semiconductor thin film on a supporting substrate), for example the electric field component perpendicular to the channel forming region in a direction draining the electrons, as a result the inhibit S/D voltage is reduced. The upper limit of the range of the write inhibit voltage (inhibit S/D voltage) to the source region and drain region of a non-selected memory element connected to the selected word line becomes the voltage of twice that of the related art. The range of the write inhibit voltage is therefore greatly increased.

By the increase of the range of the write inhibit voltage, the programming voltage supplied to the selected word line can be raised, therefore a greater option for higher speed programming is obtained.

The increase of the range of this inhibit S/D voltage becomes particularly notable the shorter the gate length contrary to the FG type and is a phenomenon peculiar to a MONOS type or other nonvolatile memory device in which the charge storing means is made planarly discrete. From the results of various studies described later, it was clarified that this phenomenon was related to the degree of depletion of the channel forming region by the application of the inhibit S/D voltage and that the application of the gate voltage was effective for the increase of the range of the inhibit S/D voltage. Namely, in a fine structure gate region having a short gate length in a nonvolatile semiconductor memory device in which the charge storing means is made planarly discrete, the fact that most of the channel forming region becomes depleted when the voltage is set so as to make the voltage of a non-selected word line the same as the voltage of the channel forming region and therefore the electric field component draining the charge to the substrate side is produced over the surface of most of the channel forming region is a factor preventing one from securing a disturb margin. This deterioration phenomenon is particularly remarkable when the depletion layers extend from the source and drain to the channel forming region and they merge there. The application of voltage to the non-selected word line in the present invention enables a reduction of this electric field component.

On the other hand, in an FG type device, when a reverse bias voltage is supplied to the drain or source, when the gate length is long, the voltage difference between the floating gate and drain or source becomes large and the disturbance margin becomes small. When the gate length is short, the coupling ratio of the drain or source with the floating gate becomes large and a larger component of the voltage of the floating gate becomes proportional to the change of the drain or source voltage, so the disturbance margin is conversely increased. This increase is particularly remarkable in a state where the depletion layers extend from the drain and source to the channel forming region where they merge. For this reason, there is no need to supply the reverse bias voltage to the non-selected word lines of the short gate length FG type memory element. As a result, the application of the reverse bias voltage is effective in the case of a long gate length FG type element.

Accordingly, the application of for example a reverse bias voltage to a non-selected word line has special meaning in a nonvolatile memory device in which the charge storing means is made planarly discrete and is extremely effective for improvement of the write disturb characteristic by an action different from that of the FG type and in turn an increase of the write speed.

BRIEF DESCRIPTION OF THE DRAWINGS

These and other objects and features of the present invention will become more apparent from the following description given with reference to the accompanying drawings, wherein:

FIG. 23 is a table of conditions for evaluation of the inhibit characteristic (bias setting and judgement condition of inhibit voltage margin) in the present invention and the related art.

DESCRIPTION OF THE PREFERRED EMBODIMENTS

Before describing the preferred embodiments of the present invention, general matters related to the present invention will be described.

The present invention can be widely applied to nonvolatile memories of the NOR type, NAND type, and various other cell methods. A NOR type nonvolatile memory includes memories of cell structures in which the bit lines and source lines are arranged at different layers, for example, an AND type nonvolatile memory and a DINOR type nonvolatile memory.

In general, when investigating the principal characteristics of a nonvolatile memory, to confirm the cell operation, desirable use is made of the concrete cell structure to evaluate the disturbance characteristic under bias conditions, which differ for every cell structure. Further, to confirm the scaling property in the current generation or next generation, desirably the relationship between the gate length and the disturb margin is clarified. Therefore, the inventors of the present application engaged in various studies for delving into the factors determining the program disturbance margin of a nonvolatile semiconductor memory in which the charge storing layer is made planarly discrete such as one of the MONOS type using a NOR type as an example so as to examine the problems in further miniaturization of the elements.

First, the result of the studies for finding the optimum range of the inhibit S/D voltage, which revealed the problem in setting the bias and constituting background art of the present invention, will be described. After this, embodiments of the present invention will be described in detail while showing the efficacy of the present invention by showing characteristics of the nonvolatile memory after application of the present invention. Note that current one-transistor NOR type memory devices mostly use floating gates (FG), therefore it is important to clarify the difference between the present invention and the FG type. Accordingly, the following explanation will be proceeded with while appropriately considering the FG type by way of comparison.

Allowable Range of Inhibit S/D Voltage as Background Art of Present Invention

Figure 22:
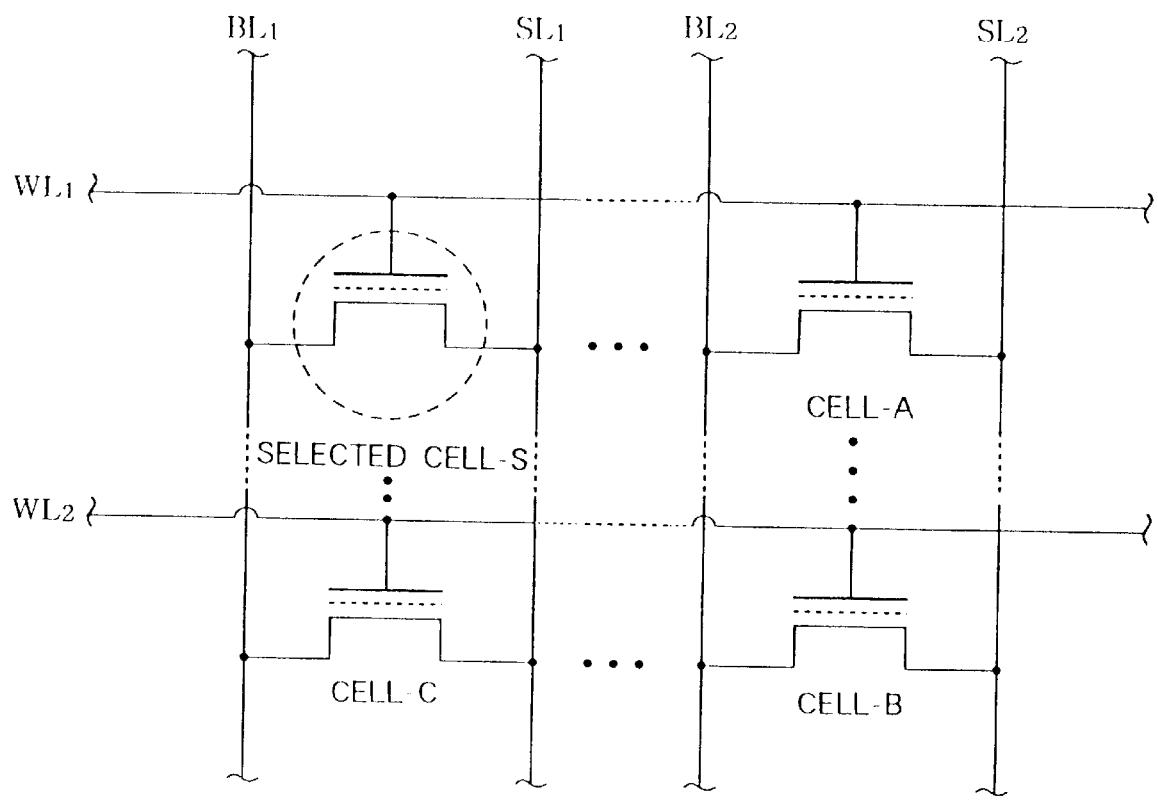
FIG. 22 is a circuit diagram of a source-isolated NOR type cell array used when investigating the optimum range of the inhibit S/D voltage as a related art of the present invention.

FIG. 22 is a view illustrating a cell array of a source-separated NOR type used in the study. Here, the non-selected state cell (non-selected cell) connected to the selected word line $WL_1$ is defined as cell A, the non-selected state cell connected to the non-selected word line $WL_2$ and connected to the selected source line $SL_1$ and the selected bit line $BL_1$ the same as the selected state cell S is defined as cell C, and the non-selected state cell connected to the non-selected word line $WL_2$ and connected to the non-selected source line $SL_2$ and the non-selected bit line $BL_2$ is defined as cell B. In this example, the number of word lines in one string was 100.

Note that a "selected word line" means a word line biased (supplied with voltage) so as to select a word, while a "non-selected word line" means a word line unbiased so as not to select the word. Similarly, a "selected bit line" means a bit line biased so as to select a bit, while a "non-selected bit line" means a bit line unbiased so as not to select the bit.

At the time of a write operation of a NOR type cell, a programming voltage (for example 10 V) is supplied to the selected word line $WL_1$ in a state where the non-selected source line $SL_2$ and the non-selected bit line $BL_2$ are simultaneously reverse biased, that is, a positive voltage is supplied to the substrate or well or other channel forming region (0 V), whereby the programming disturbance of the non-selected cells A to C is suppressed. At this time, the other word line $WL_2$, bit line $BL_1$, and source line $SL_1$ have zero voltage (0 V), therefore a high voltage is supplied between the gate of the selected cell S and the channel forming region, electrons are injected from the substrate side, and therefore writing is carried out, while the non-selected cell A becomes a weak write state and the non-selected cell B becomes a weak erase state. Accordingly, to realize a one-transistor type cell, it becomes important how the write disturbance of these non-selected cells A and B is suppressed.

Therefore, the relationship between the programming voltage and the voltage supplied to the non-selected source line $WL_2$ and the non-selected bit line $BL_2$ (inhibit source/drain (S/D) voltage) was studied to determine the magnitude of the disturb margin of the inhibit S/D voltage. Specifically, the gate length dependency of the relationship between the gate voltage and the inhibit S/D voltage (inhibit characteristic) was evaluated under the conditions for evaluation of the inhibit characteristic shown in FIG. 23 (conditions for judgement of bias setting and margin of time).

Figure 24:
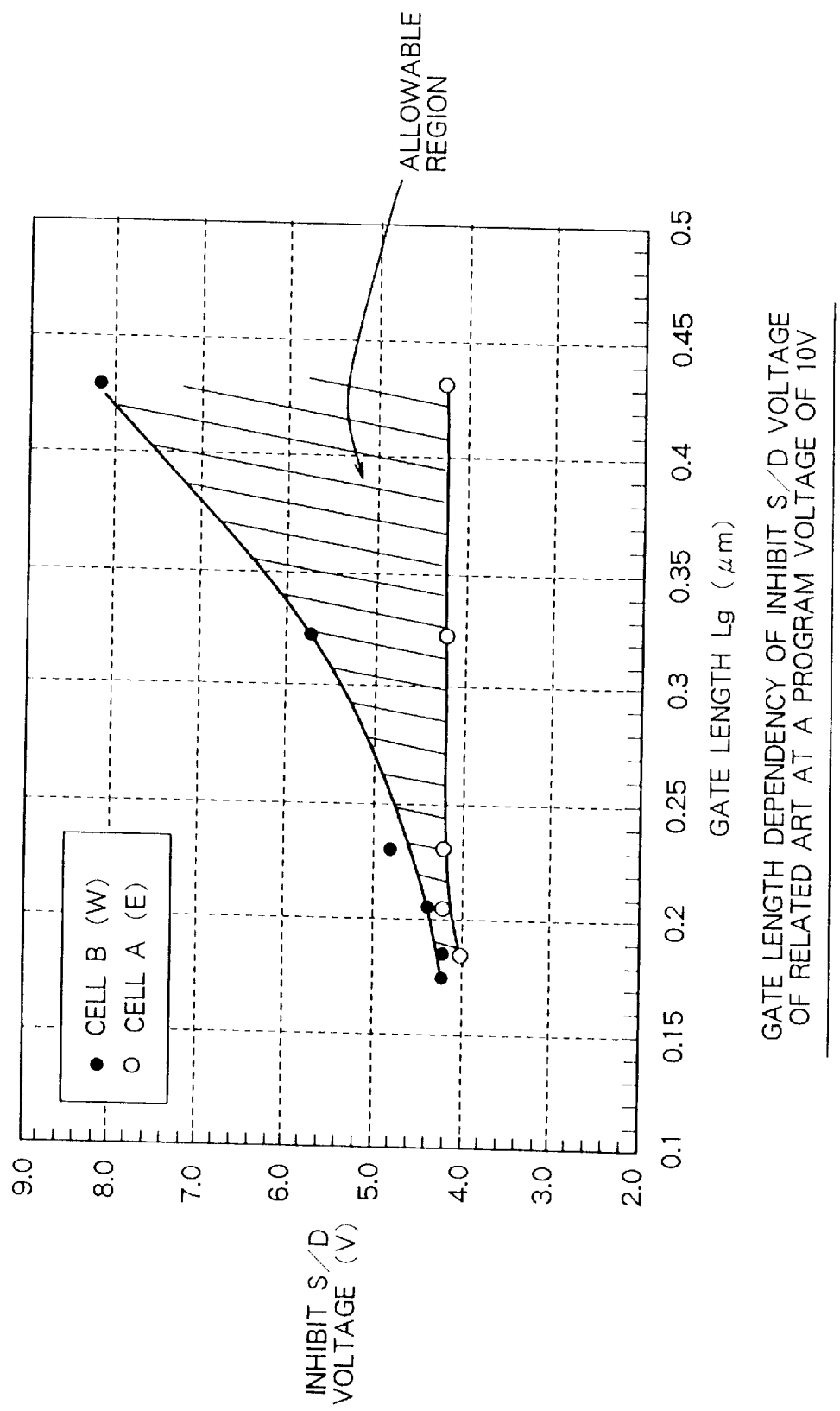
FIG. 24 is a graph of the result of evaluation of the gate length dependency of the relationship between the gate voltage and the inhibit S/D voltage (inhibit characteristic) as the result of investigation referring to FIG. 22.

FIG. 24 is a graph of the result of this evaluation.

As shown in FIG. 24, through the evaluation of the program disturb characteristic using a NOR type cell MONOS type nonvolatile memory, it was found that there is an allowable region of the inhibit S/D voltage (hatched portion in FIG. 24) and that the upper limit thereof was determined by the disturb characteristic in the write state of the non-selected cell B and the lower limit was determined by the disturb characteristic in the erase state of the non-selected cell A.

Further, it was found that in a MONOS type nonvolatile memory, the upper limit of the inhibit S/D voltage in the non-selected cell B decreased as the gate length become shorter, so with the impurity concentration (density) of the channel forming region used for the experiment, the allowable inhibit voltage margin became almost zero when the gate length became shorter than 0.2 $\mu$m. Further, it was also seen that when the impurity concentration of the channel forming region was lower than that of the present experiment, the allowable inhibit voltage margin was shifted to that of a long gate length region. This is because the depletion layers extend from the source and drain to the channel forming region, and then they merge due to the application of the inhibit S/D voltage. As a result, the stored charges are emitted from the charge storing means by the erase electric field from the source region or drain region in substantially the entire region on the channel forming region.

Note that while the above problem was described with reference to a MONOS type device, there is a similar problem making realization of a one-transistor cell difficult in other nonvolatile memories in which the charge storing layer is made planarly discrete (dispersed), for example, an MNOS type.

On the other hand, the allowable, range of the inhibit S/D voltage in an FG type nonvolatile memory has a reverse gate length dependency, that is, the allowable optimum range increases at the shorter gate length side more than the longer gate length side, so a sufficient allowance of the inhibit S/D voltage is secured in a wide gate length range.

This difference between the FG type and the MONOS type suggests that the mechanism for determining the allowable range of the inhibit S/D voltage is different between the two.

As a result of the above studies, the inventors of the present application found that the upper limit of allowable inhibit voltage which can be supplied to the source and drain of a non-selected cell connected to a non-selected word line and non-selected bit line decrease along with the shortening of the gate length in a NOR type nonvolatile memory. Further, the inventors learned that the reason why a allowable inhibit voltage margin cannot be secured if the gate length is less than 0.2 μm in the MONOS type nonvolatile memory used for this investigation was that charge was emitted from the charge storing means by the erase electric field from the depletion layer due to the extension of the depletion layer from the source or drain to the channel forming region. It was confirmed that this phenomenon was peculiar to a memory element in which the charge storing means, such as a charge trap in an ONO film, is made planarly dispersed and could not seen in the usual FG type. It is believed that this reduction of the margin on the short gate length side occurs due to the emission of electrons in the ONO film or other silicon nano-crystal (Si nano-crystal, described in detail later), fine isolated type floating gate, or other planarly dispersed charge holding medium to the channel forming region side of the transistor. For this reason, the issue becomes the magnitude of the electric field in the channel vertical direction. When the electric field of this vertical direction is produced over the entire surface of the channel, the program disturb becomes remarkable. This occurs in the short channel region to an extent that the depletion layers extend from the source and drain regions to the channel forming region where they merge when the inhibit voltage is supplied.

Therefore, in these studies, the inventors examined the magnitude and distribution of the electric field component in the channel vertical direction and the gate voltage and gate length dependency of the electric field component etc. using a two-dimensional device simulator. As a result, they proved as expected that, to reduce the electric field component omitting the electrons, application of a positive gate voltage to the p-type substrate or p-type well (reverse bias voltage to the channel forming region) was effective and that it was particularly effective at the ultra-fine gate length side at which the channel forming region was completely depleted. Further, they discovered that application of a reverse bias voltage to non-selected word line enabled a great increase of the allowable inhibit voltage margin for the non-selected cell and leeway for improvement for the other non-selected cells, and therefore that it was effective to reverse bias the gate electrode with respect to the channel forming region in order to improve the write disturb characteristic of both of the non-selected cell and the other non-selected cells connected to the same non-selected bit line and having commonly connected drain regions.

The nonvolatile memory of the present invention or the nonvolatile memories to which the technical concept of the present invention can be preferably applied has a memory element (memory transistor) in which the charge storing means in the gate insulating film is arranged planarly discrete.

Here, the term "charge storing means" means the charge holding medium which is formed in the gate insulating film, transfers a charge with the channel forming region side in response to the voltage supplied to the gate electrode on that gate insulating film, and holds the charge. Further, "planarly dispersed charge storing means" means an oxide-nitride-oxide (ONO) film, nitride-oxide (NO), or other nitride film bulk carrier trap, a carrier trap formed near the interface of the oxide film and nitride film, silicon or other nano-crystals with a particle size on the order of 10 nanometers (nm) or less mutually insulated from each other, a polycrystalline silicon or other fine division floating gate divided into fine dots which are mutually isolated from each other, etc.

The present invention relates to the setting of the write inhibit voltage. The increase of the margin thereof is achieved by supplying a voltage in the polarity becoming a reverse bias for the channel forming region to the non-selected word line at the time of a write operation and in that state supplying a reverse bias voltage (for example the same voltage) to the non-selected source line and bit line or other common line so as to inhibit erroneous writing or erroneous erasing of the non-selected cells A and B.

The terms related to the present invention will be also defined below.

The term "channel forming region" means the region forming the channel for conduction of the electrons or positive holes in the internal portion of the surface side. The term "channel forming region" means, in the strict sense, for example not only the surface part of the semiconductor substrate, but also parts of the well formed at the surface side in the substrate, the epitaxial growth layer formed at the surface of the semiconductor substrate, the silicon on insulator (SOI) layer, and the like and, in the broader sense, the semiconductor substrate, wells, epitaxial growth layer, and SOI layer as a whole.

The term "polarity becoming a reverse bias for the channel forming region" means the polarity in which the application of voltage is to the plus side (positive side) or minus side (negative side) based on the voltage of the channel forming region. Described more specifically, the polarity where the conductivity type of the channel forming region is the p-type semiconductor becomes the plus side and the direction where it is the n-type semiconductor becomes the minus side.

The term "common line" means a line to which source regions or drain regions of a plurality of memory transistors in for example the bit line direction (column direction) are commonly directly connected or capacity coupled. For example, it may be not only a bit line or source line, but also a so-called booster plate or the like.

Below, preferred embodiments of the present invention will be described with reference to the accompanying drawings.

First Embodiment

As a nonvolatile semiconductor memory device of a first embodiment in accordance with the present invention and a writing and erasing method of the same, a description will be given of a MONOS type nonvolatile memory in which the gate insulating film is made of an ONO film.

Figure 1:
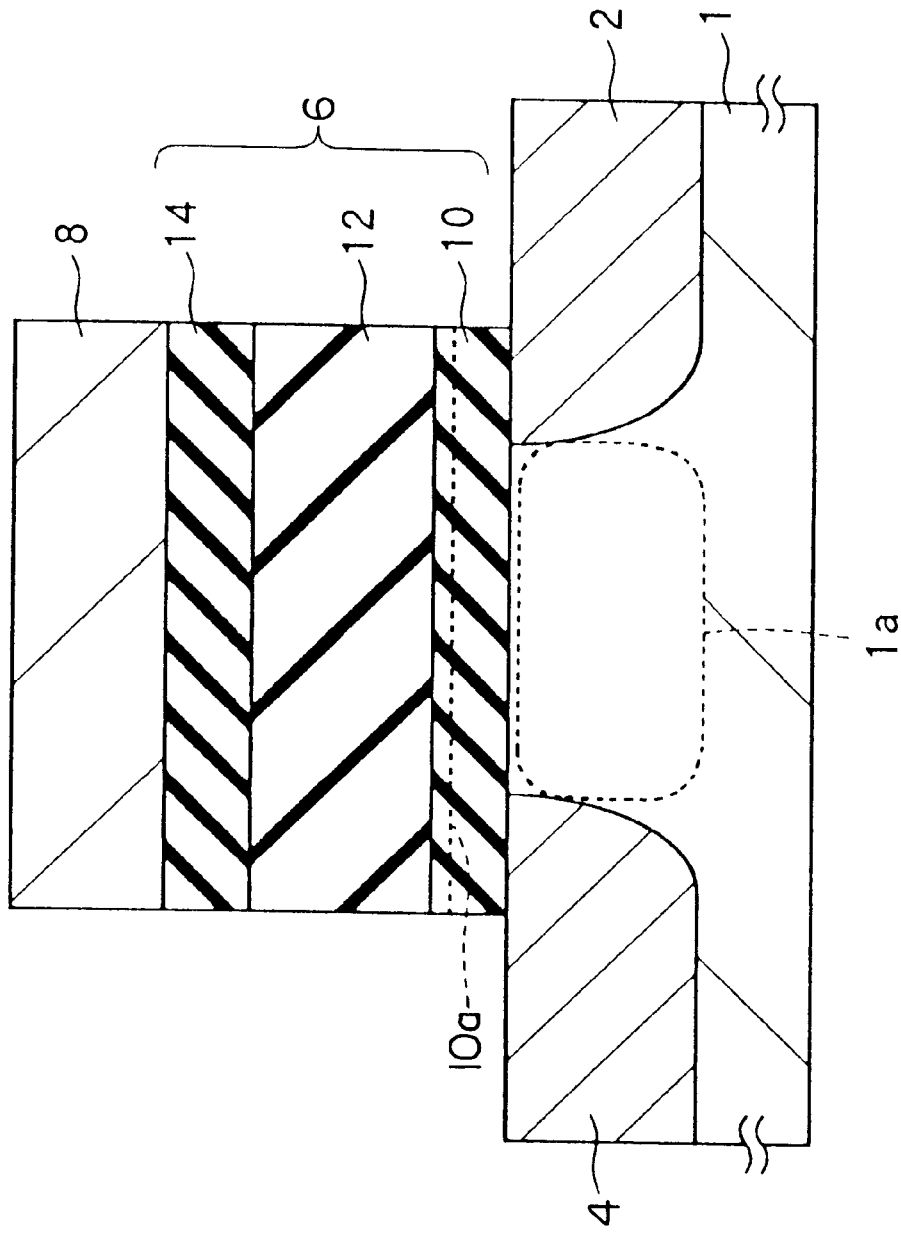
FIG. 1 is a sectional view showing an element structure of a MONOS type nonvolatile memory transistor according to a first embodiment of the present invention.
Figure 2:
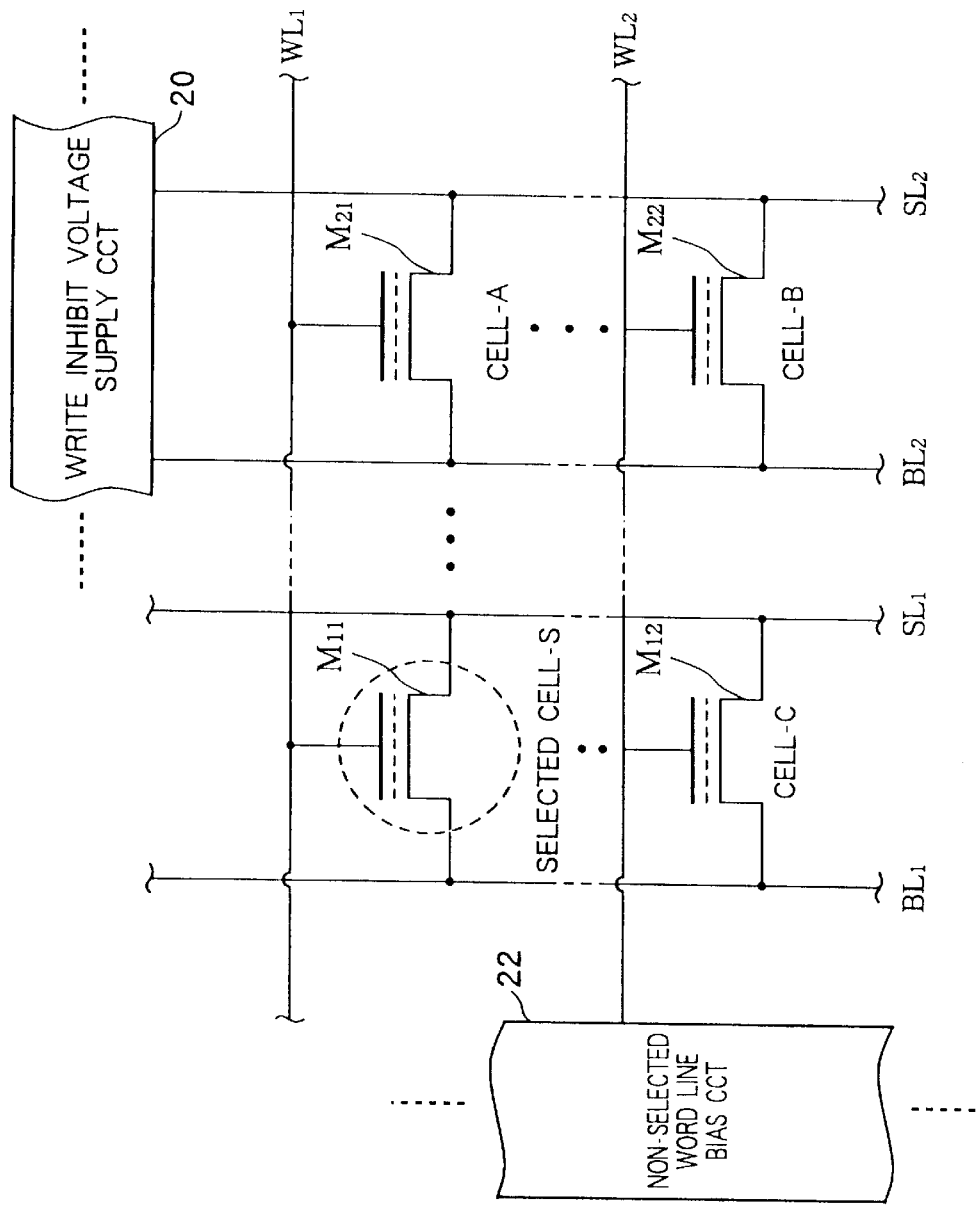
FIG. 2 is a circuit diagram of the configuration of principal parts of the MONOS type nonvolatile memory device according to the first embodiment of the present invention.

FIG. 1 is a sectional view of the structure of a MONOS type memory transistor; while FIG. 2 is a circuit diagram of the configuration of principal parts of the MONOS type nonvolatile memory device.

In the figure, reference numeral 1 denotes a silicon wafer or other semiconductor substrate having an n-type or p-type conductivity type, 1a denotes a channel forming region, and 2 and 4 denote a source region and a drain region of the memory transistor.

The term "channel forming region 1a" in the first embodiment corresponds to the part sandwiched by the source region 2 and the drain region 4 in the substrate 1 (broken line part).

The source region 2 and the drain region 4 are regions having a high conductivity formed by introducing an impurity having a reverse conductivity type to that of the channel forming region 1a into the semiconductor substrate 1 with a high concentration (density). There are various forms. Usually, a low concentration impurity region referred to as a lightly doped drain (LDD) is provided at the position of the substrate surface facing the channel forming region 1a between the source region 2 and the drain region 4. An example in which this is configured in this way will be described in the first embodiment.

On the channel forming region 1a, a gate electrode 8 of the memory transistor is stacked via a gate insulating film 6. The gate electrode 8 is generally made of polycrystalline silicon made conductive by introducing a p-type or n-type impurity at a high concentration (doped poly-Si) or a stacked layer film of doped poly-Si and a high melting point metal silicide.

The gate insulating film 6 is formed by a tunnel insulating film 10, a nitride film 12, and a top oxide film 14 in that order from the bottom layer to the top layer.

The tunnel insulating film 10 is made of for example silicon oxide ($SiO_2$) formed by for example thermal oxidation. Electrons are directly carried in this insulating film by tunneling effect. Further, in the MONOS type, a triangle potential (trial potential) formed by the tunnel insulating film 10 and a part of the nitride film 12 becomes the region through which electrons are effectively tunneled. The electrons inside this are carried by utilizing modified Fowler-Nordheim (modified FN) tunneling. The thickness of the tunnel insulating film 10 can be set within the range of 2.0 nm to 3.6 nm in accordance with the purpose of use and is set to 2.8 nm in the first embodiment. Further, at least the surface portion of the tunnel insulating film 10 in the first embodiment is subjected to thermal nitridation to form a thin oxynitride layer 10a.

The nitride film 12 is formed by a silicon nitride ($Si_xN_y$ (0<x<1, 0<y<1)) film of for example 5.0 nm.

For the top oxide film 14, it is necessary to form deep carrier traps with the nitride film 12 at a high density, therefore it is formed by thermally oxidizing the nitride film after formation. Where the top oxide film 14 is formed by a CVD process, the traps are formed by heat treatment. The thickness of the top oxide film 14 must be 3.0 nm at the minimum, preferably 3.5 nm or more, so as to prevent the injection of holes from the gate electrode 8.

Next, an example of the method of manufacture of a memory transistor having such a structure will be simply described focusing on the gate insulating film process.

First, an explanation will be made of the basic flow of the basic manufacturing method. (1) The semiconductor substrate 1 is formed with the element-isolation regions, is formed with the wells, is implanted with ions for adjusting the gate threshold voltage Vth, etc. in accordance with need; (2) the gate electrode 8 is stacked on the active region of the semiconductor substrate 1 via the gate insulating film 6; (3) source and drain regions 2 and 4 are formed in self-alignment with this; (4) an inter-layer insulating film and contact holes are formed; (5) the source and drain regions are formed, upper layer interconnections are formed via the inter-layer insulation layer in accordance with need, an over coat is formed, and windows are formed, and so on to complete the nonvolatile memory transistor.

In the step of forming the gate insulating film 6, (a) first the silicon substrate 1 is thermally oxidized by the rapid thermal oxidation method (RTO method) in an atmosphere obtained by mixing dilute oxygen into nitrogen to form the tunnel insulating film 10 (final thickness: 2.8 nm). (b) Next, a rapid thermal nitridation treatment (RTN treatment) is carried out on the tunnel insulating film 10 in an ammonia atmosphere under conditions of for example a furnace temperature of 1000° C. and a treatment time of one minute. (c) Next, the nitride film 12 is stacked by a low pressure CVD process to be thicker than 5.0 nm to give a final thickness of 5.0 nm. This CVD is carried out by using a gas obtained by mixing for example dichlorosilane (DCS) and ammonia and at a substrate temperature of 650° C. In the formation of the silicon nitride film on this thermally oxidized film, according to need, preferably the pretreatment (wafer pretreatment) and film formation conditions of the underlying surface are optimized in advance so as to suppress any increase of roughness of the finished film surface. In this case, if the wafer pretreatment is not optimized, the surface morphology of the silicon nitride film becomes poor and the correct film thickness cannot be measured, therefore the film thickness is set taking into account the decrease of the silicon nitride film causing thinning of the film in the next thermal oxidation step after the wafer pretreatment is sufficiently optimized.

The surface of the formed silicon nitride film is oxidized by the thermal oxidation method to form the top oxide film 14 (3.5 nm). This thermal oxidation is carried out in for example an $H_2O$ atmosphere at a furnace temperature of 950° C. By this, deep carrier traps in which the trap level (energy difference of the silicon nitride film from the conductive band) is 2.0 eV or less are formed at a density (concentration) of about 1 to $2\times10^{13}/cm^2$. Further, the thermally oxidized silicon oxide film (top oxide film 14) is formed with a ratio of 1.6 nm with respect to 1 nm of the nitride film 12. The thickness of the nitride film 12 serving as the underlying layer is decreased by this ratio. The final thickness of the nitride film 12 becomes 5 nm.

In the nonvolatile memory of the present example, as shown in FIG. 2, the memory cell of the NOR type cell array is configured by a single memory transistor having the above structure. In the NOR type cell array, memory transistors $M_{11}$ to $M_{22}$ are arranged in a matrix. These transistors are connected to each other by the word lines WL, bit lines BL, and the isolation type source lines SL in the same way as FIG. 22. Further, the cells A to C and the cell S are defined in the same way as in FIG. 22.

Namely, the non-selected state cell (non-selected cell) connected to the selected word line $WL_1$ is defined as cell A, the non-selected state cell which is connected to the non-selected word line $WL_2$ and connected to the selected source line $SL_1$ and the selected bit line $BL_1$ the same as the selected state cell S is defined as cell C, and the non-selected state cell connected to the non-selected word line $WL_2$ and connected to the non-selected source line $SL_2$ and the non-selected bit line $BL_2$ is defined as cell B. Note that a "selected word line" means a word line which is programmed (to which voltage is supplied) so as to select a word, while a "non-selected word line" means a word line deprogrammed so as not to select a word. Similarly, a "selected bit line" means a bit line energized so as to select a bit, while a "non-selected bit line" means a bit line deenergized so as not to select a bit.

Note that, in FIG. 2, for the simplification of the illustration, four cells are shown, but in an actual cell array, a large number of cells are constituted by similar repeated arrangement and connection.

In the nonvolatile memory according to this embodiment of the present invention, provision is made for a write inhibit voltage supplying circuit 20 which is connected to at least the non-selected bit lines and source lines and supplies a reverse bias to a pn junction of the channel forming region 1a with the source region 2 and drain region 4 (FIG. 1) of the non-selected memory transistor and a non-selected word line bias circuit 22 which is connected to at least the non-selected word line and supplies a voltage based on the element forming region to the gate electrode 8.

The write inhibit voltage supplying circuit 20 and the non-selected word line bias circuit 22 supply a predetermined voltage in a polarity becoming a reverse bias for the channel forming region 1a, for example, a positive voltage (hereinafter also simply referred to as a positive bias voltage, and this expression is the same as "reverse bias to the channel region") to the non-selected word line preceding the programming of the selected cell, then supply a voltage becoming a reverse bias for the channel forming region 1a (hereinafter also simply referred to as a reverse bias voltage) to the source region 2 and the drain region 4, thereby greatly improve the programming disturbance margin.

Note that the description below will be continued on the assumption that the write inhibit voltage supplying circuit 20 simultaneously gives the same reverse bias voltage to both of the source region 2 and the drain region 4 of the memory transistor, but in the present embodiment, the reverse bias voltage is not limited to the same voltage. It is also possible to give a reverse bias voltage to either of the source region 2 and the drain region 4 and make the other open. Further, it is also possible to apply different voltages to the source line and the bit line.

In a nonvolatile memory of such a structure, when writing data into the selected cell S, by the non-selected word line bias circuit 22 supplies a predetermined voltage, for example, 3.5 V, to the non-selected word line $WL_2$ when the substrate voltage is 0 V. Further, the write inhibit voltage supplying circuit 20 supplies the predetermined reverse bias voltage, for example, 5 V, to the non-selected source line $SL_2$ and the non-selected bit line $BL_2$ when the substrate voltage is 0 V and holds the selected source line $SL_1$ and the selected bit line $BL_1$ at the voltage 0 V.

When the programming voltage (for example, 10 V to 12 V) is supplied to the selected word line $WL_1$ in this state, in the memory transistor $M_{11}$ of the selected cell S, charges are injected by tunneling from the entire surface of the channel forming region 1a of the substrate 1 into the charge storing means thereof, whereby the threshold voltage Vth changes and the data is written. Note that, preferably the order of the application of the bias voltage must be (1) application of a positive bias voltage to non-selected word line, (2) application of a reverse bias voltage to non-selected source lines and bit lines, and (3) application of a programming voltage as mentioned above. If this order is used, the disturbance of the non-selected cell B will be improved.

Between the reverse bias voltage and the bias voltage (positive bias voltage) of the non-selected word line in the present embodiment, preferably the reverse bias voltage is set larger when compared in terms of the absolute value. In accordance with the values of the two bias voltages, at the time of a write operation, the non-selected cell A becomes a weak write state and the non-selected cell B is becomes in the weak erase state, but as will be described in detail later, due to the application of the bias voltage to the non-selected word line, the allowable margin of inhibit voltage is greatly increased particularly on the upper limit side, therefore it is possible to effectively prevent disturbances at the time of write operations in both non-selected cells. Note that, for the non-selected cell C as well, since the weak write state is exhibited at the substrate voltage of 0 V, it is necessary to determine the value of the bias voltage of the non-selected word line taking into account the prevention of this programming disturb.

[Gate Length Dependency of Allowable Range of Inhibit S/d Voltage]

Figure 3:
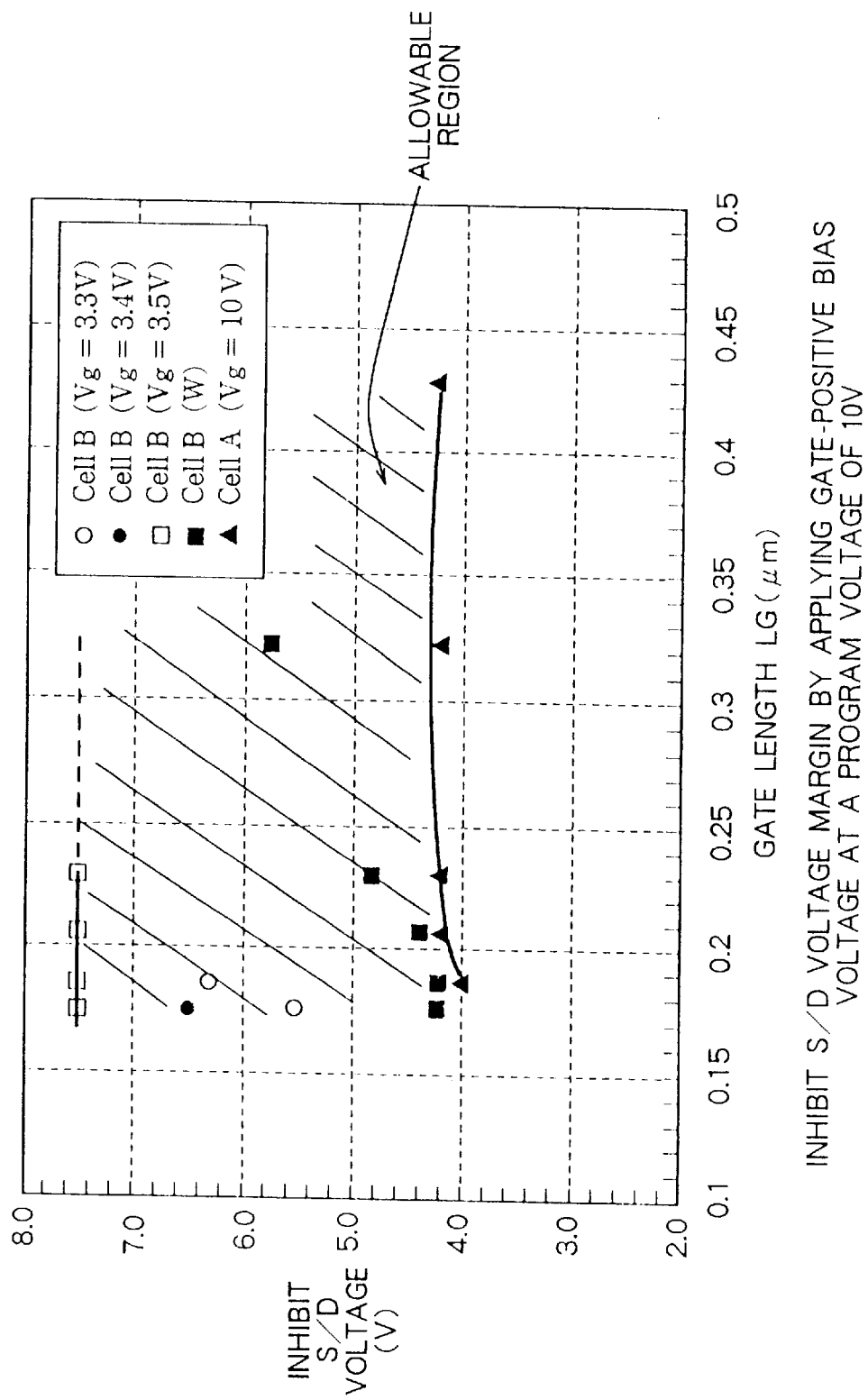
FIG. 3 is a graph of a result of evaluation of a gate length dependency of an optimum range of an inhibit source/drain (S/D) voltage evaluated for non-selected cells A and B under bias conditions at the time of writing in the first embodiment of the present invention.

The gate length dependency of the allowable range of the inhibit S/D voltage was measured for the non-selected cells A and B under the bias conditions of the write operation described above in the same way as that of FIG. 24. The result of this is shown in FIG. 3. Note that the conditions of application of the pulse voltage and the conditions of judgement in this measurement were made the same as those in FIG. 24.

As a result, it was seen that the upper limit of the allowable range of the inhibit S/D voltage became 7.5 V or more in a wide gate length range by applying 3.5 V of bias voltage to the non-selected word line.

Further, as will be described later with reference to the content illustrated in FIG. 7, it is possible to supply the non-selected word line with a voltage of 4.2 V in the case of a long gate length and supply a further larger voltage in the case of a gate length of 0.2 μm or less, therefore the upper limit of the inhibit S/D voltage is further increased.

Due to the above, a tremendous improvement was made regarding the disadvantage that allowable range of inhibit S/D voltage become very small at a gate side shorter than 0.2 μm shown in FIG. 24. Further, in FIG. 3, only the data up to 0.18 μm was shown, but it was confirmed that the allowable range of inhibit S/D voltage was greatly improved by also supplying the bias voltage to the non-selected word line in the region where the gate length is further shorter. Further, as will be mentioned later, it was confirmed that the disturb tolerance of the non-selected cell B was greatly improved by supplying a positive bias voltage to the non-selected word line even in a case where the threshold voltage of the write state is increased from 2 V to 2.5 V.

These results show that the application of voltage in the polarity becoming a reverse bias for the channel forming region 1a to the non-selected word line is sufficient also in a 0.18 μm or later generation MONOS type memory transistor in the point of securing a margin of the allowable inhibit S/D voltage.

The ability to set a high inhibit S/D voltage means an increase in the programming disturb margin of the non-selected cell A. Further, if the program inhibit voltage margin of the non-selected cell A is the same, this means that there is that much greater room for raising the selected word line voltage, that is, the programming voltage.

[Intensity Distribution of Electric Field in Channel Vertical Direction]

As described above, the great improvement of the program inhibit voltage margin is peculiar to the MONOS type device. The shorter the gate length, the larger the effect of improvement. Further, the bias condition where this improvement occurs is the direction of application of the electric field for causing depletion of the channel. Therefore it is important to investigate the distribution of electric field in the channel forming region. Further, when examining the amount of reduction of the threshold voltage due to the program disturb, the orientation and magnitude of the electric field applied to the ONO film in the channel vertical direction become important.

Therefore, the inventors conducted a simulation of the gate length dependency of the distribution of the electric field of the MONOS type transistor using a two-dimensional device simulation technique. As a result, it is found that where both of the source and drain are reverse biased, the bias voltage thereof exerted an influence upon the channel center, a negative channel vertical direction electric field acts in a direction emitting electrons from the traps of the ONO film, and the intensity of the electric field of the channel vertical direction became the maximum under the gate edge portion.

Further, the fact that, when the gate voltage is constant, the maximum electric field at this time does not exhibit any gate length dependency, but as the gate length becomes shorter, the orientation of the electric field at the center portion of the gate changes from the direction holding electrons trapped in the ONO film to the direction emitting electrons was also shown in the simulation.

Figure 4:
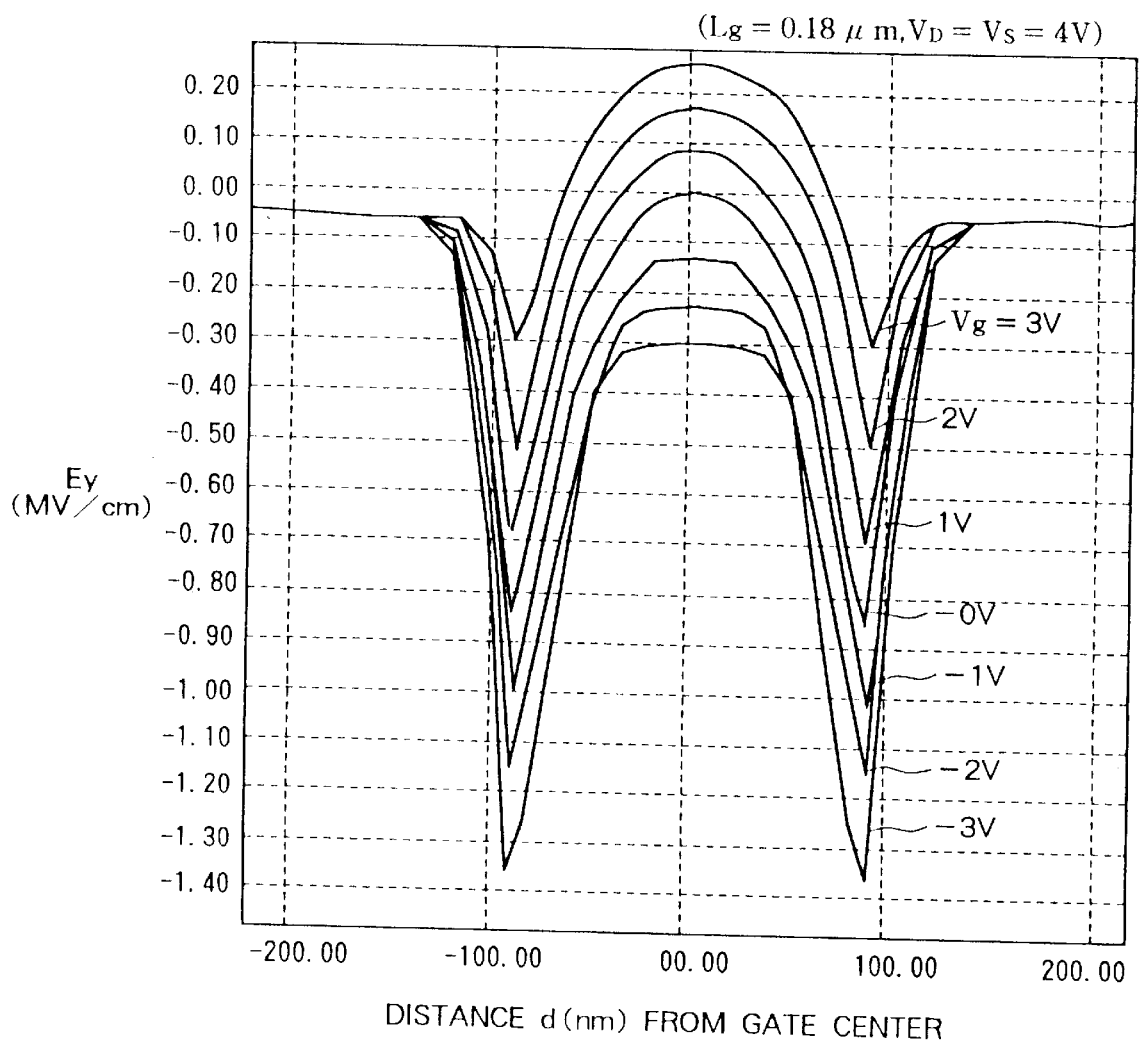
FIG. 4 is a graph of the gate voltage dependency of an electric field intensity in a channel vertical direction in the first embodiment of the present invention.

FIG. 4 is a view of the gate voltage dependency of an electric field intensity Ey of the channel vertical direction when the gate length Lg is 0.18 $\mu$m and the source voltage $V_s$ and the drain voltage $V_D$ are 4 V. It is seen from FIG. 4 that the electric field intensity Ey becomes the maximum in the direction in which electrons are emitted under the gate edge portion (negative direction of Ey). Further, it was learned that when the bias voltage Vg is supplied to the gate, a channel vertical direction electric field Ey was exerted by the influence of the gate bias voltage in all regions and particularly the maximum electric field under the gate edge tended to reduce the magnitude of the electric field acting in the direction emitting electrons trapped in the ONO film when the gate voltage is made large, that is, the electric field intensity Ey shift to the positive side.

In this way, a MONOS type nonvolatile memory has a function whereby the high electric field acting in the channel forming region due to the voltages supplied to the source and drain is effectively reduced when a positive bias voltage is supplied to the non-selected word line. As a result, the fact that the electric field applied to the ONO film is reduced and charges become hard to emit is the factor behind the allowable region of the inhibit S/D voltage increasing to the positive side particularly in the short gate length region.

On the other hand, in an FG type, since the charge storing means has conductivity in a planar direction, the stored charge is emitted by the voltage at an overlapped parts between the source region or drain region and the floating gate.

In the FG type nonvolatile memory transistor, the static capacitance between the floating gate and a neutral part of the channel forming region is larger and the voltage of the overlapped part becomes higher when the gate length is long, therefore the disturbance phenomenon is remarkable. Accordingly, unlike the result of the simulation of the gate length dependency of the electric field in a direction emitting electrons in the MONOS type, in the FG type, the state of application of the electric field becomes more moderate than the MONOS type when the gate length is shortened. It is considered that such a difference of the state of application of the electric field is a factor behind the increase of the allowable range of the inhibit S/D voltage in the FG type nonvolatile memory at the short gate length side as pointed out in the description referring to FIG. 24.

When considering the above results all together, in the MONOS type, where the source and drain are reverse biased, the depletion layer spreads with a short gate length and the channel forming region is depleted up to its center portion. This is closely related to the fact that the upper limit of the allowable range of the inhibit S/D voltage shown in FIG. 24 is lowered at the short gate length side and this lowers the inhibit voltage of the non-selected cell B.

[Gate Voltage Dependency of Inhibit S/D Voltage]

Figure 5:
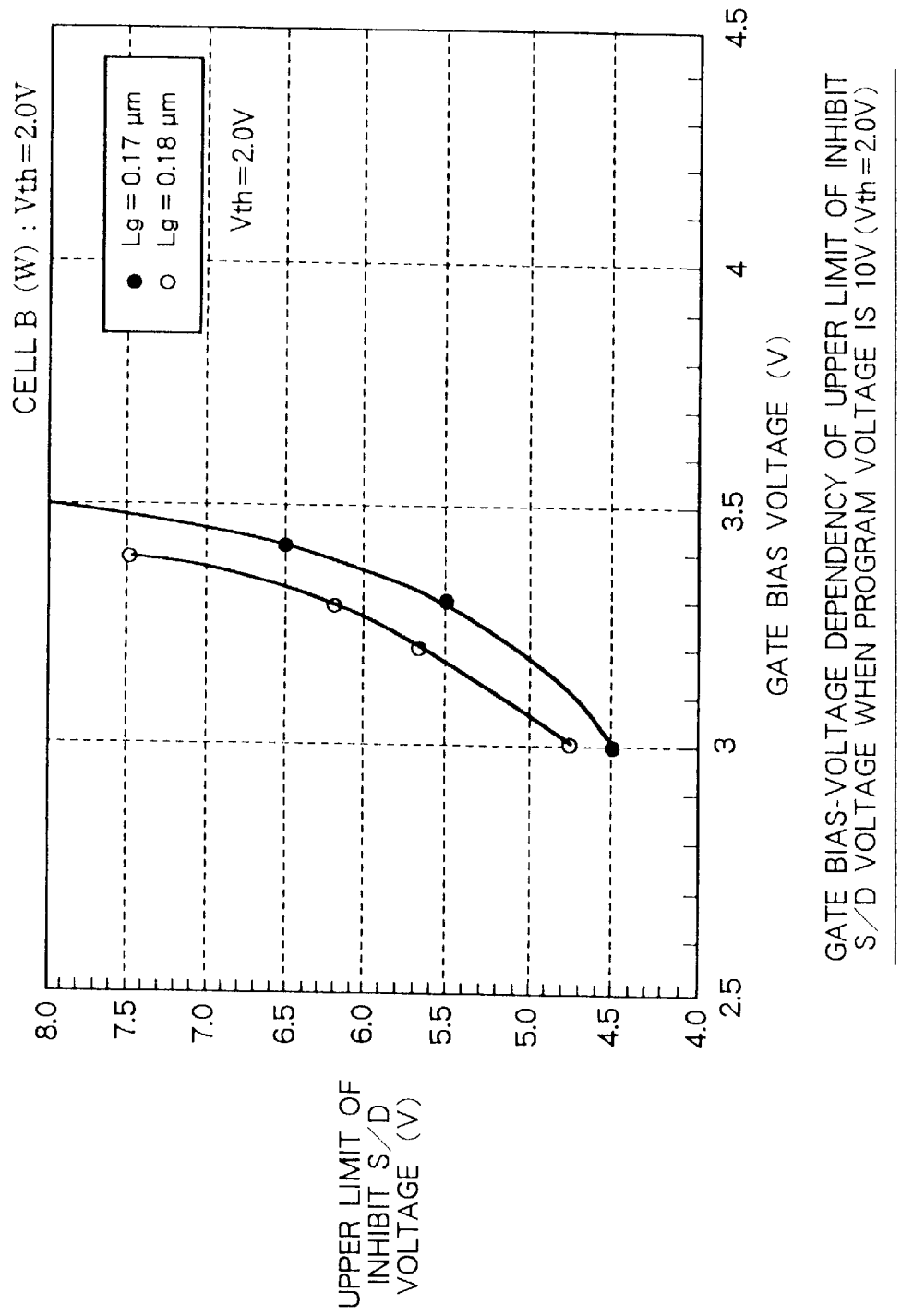
FIG. 5 is a graph of the relationship between an inhibit S/D voltage in a region where the gate length is shorter than 0.2 $\mu$m and a positive bias voltage supplied to the non-selected word line in the first embodiment of the present invention (threshold voltage Vth of write state=2.0 V)

FIG. 5 is a view of the relationship of the upper limit of the inhibit S/D voltage and the positive gate bias voltage (hereinafter also simply referred to as a gate voltage) supplied to the non-selected word line in the region where the gate length is shorter than 0.2 $\mu$m. The abscissa shows the gate bias voltage, while the ordinate shows the inhibit S/D voltage. The curve of solid dots shows the gate bias voltage dependency when the gate length Lg is 0.17 $\mu$m, while the curve of hollow dots shows the gate bias voltage dependency when the gate length Lg is 0.18 $\mu$m. As the gate bias voltage becomes higher, the upper limit of the inhibit S/D voltage steadily increases. Further, the upper limit of the inhibit S/D voltage tends to abruptly increase at a certain gate voltage. The gate bias voltage dependency of the upper limit of the inhibit S/D voltage has a weak gate length dependency.

Figure 6:
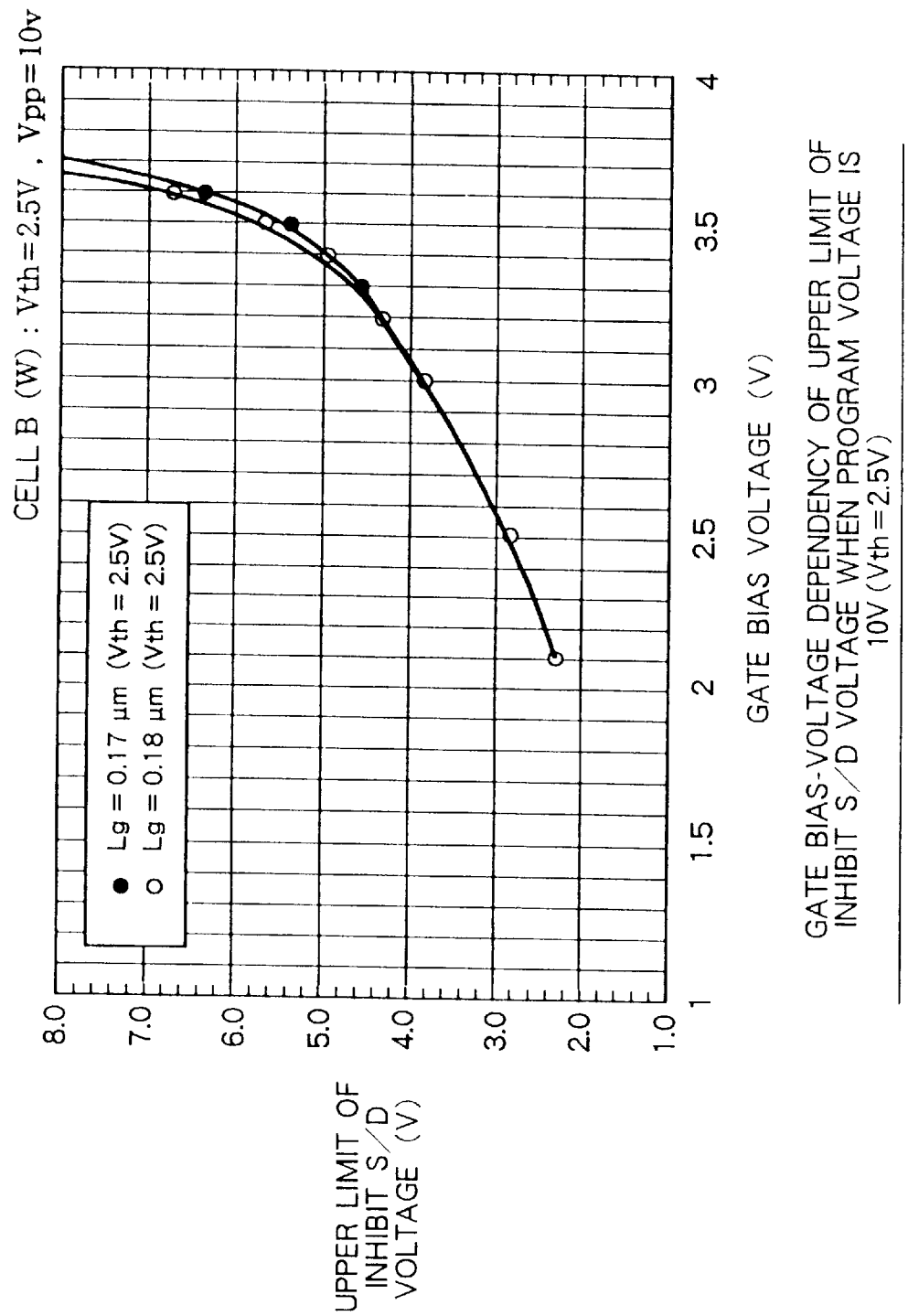
FIG. 6 is a graph of a similar relationship to that of FIG. 5 for a case where the Vth of the write state in the first embodiment of the present invention is 2.5 V.

FIG. 6 is a graph of the relationship of the upper limit of the inhibit S/D voltage and the gate voltage when the threshold voltage Vth in the write state is 2.5 V. The abscissa shows the gate bias voltage, while the ordinate shows the inhibit S/D voltage. The curve of solid dots shows the gate bias voltage dependency when the gate length Lg is 0.17 $\mu$m, while the curve of hollow dots shows the gate bias voltage dependency when the gate length Lg is 0.18 $\mu$m. In this case as well, the upper limit of the inhibit S/D voltage tends to increase as the gate voltage becomes larger. The gate voltage with which the upper limit of the inhibit S/D voltage became more than 7.5 V was 3.7 V. It was seen that this gate bias voltage had a sufficient margin with respect to the inhibit gate voltage as will be described later.

[Gate Length Dependency of Inhibit Gate Voltage of Non-selected Cell C]

Figure 7:
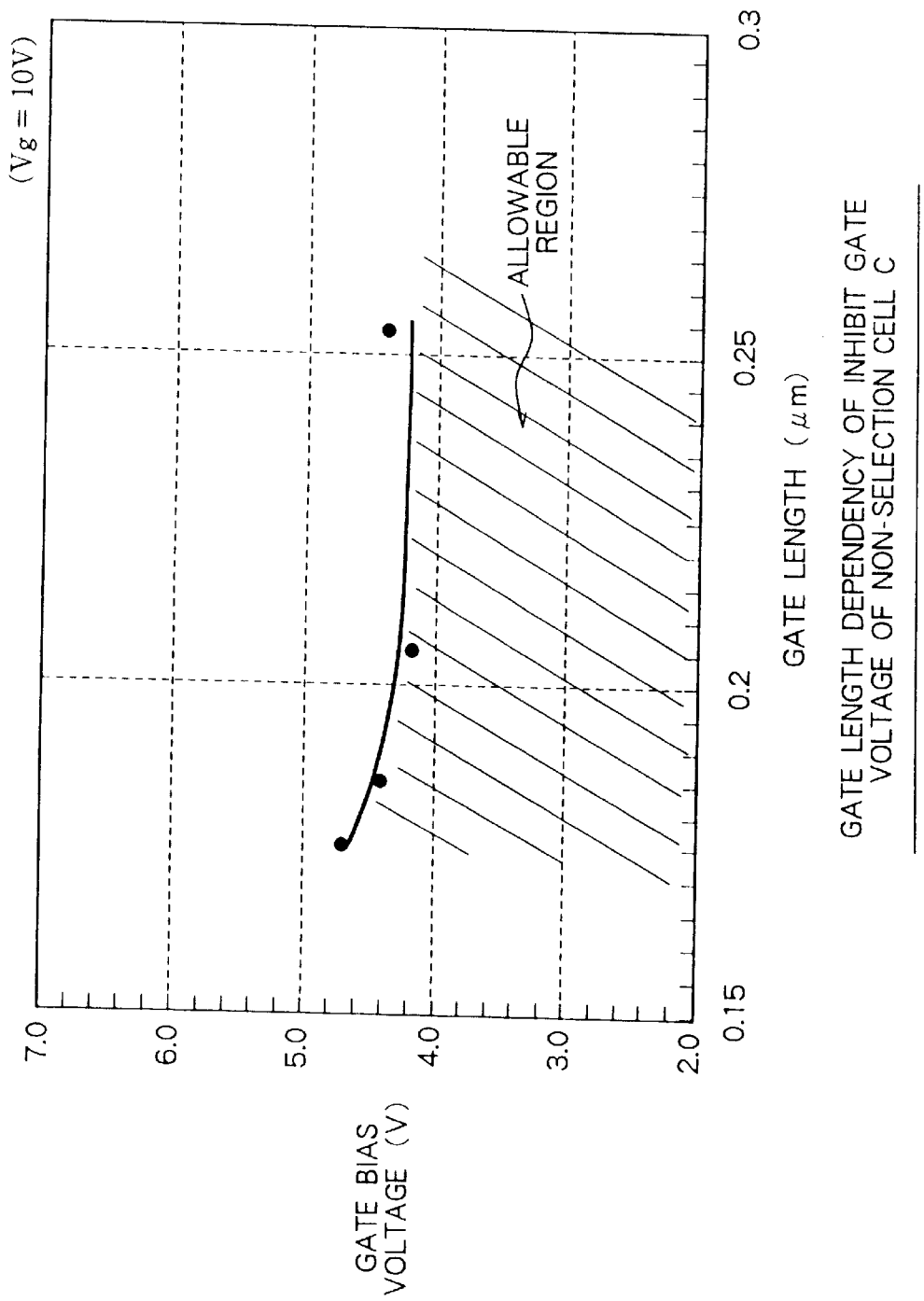
FIG. 7 is a graph of the gate length dependency of the inhibit gate voltage of a non-selected cell C in the first embodiment of the present invention.

FIG. 7 is a view of the gate length dependency of the inhibit gate voltage of the non-selected cell C. The abscissa shows the gate length, while the ordinate shows the gate bias voltage. Here, the inhibit gate voltage means the upper limit of the gate voltage not causing erroneous writing or erroneous erasing in the non-selected cell C due to application of the gate voltage.

In the non-selected cell c as well, the inhibit gate voltage exhibits a gate length dependency. The inhibit gate voltage tends to slightly increase in the region where the gate length is shorter. It was seen from FIG. 7 that the average inhibit gate voltage was 4.2 V to 4.7 V when the programming voltage was 10 V. The upper limit of the gate voltage which can be supplied to the non-selected word line in the case of each gate length (case where Vg=10 V) is determined by this value.

In FIG. 3 illustrating the non-selected cell B, the voltage (gate bias voltage) which should be supplied to the non-selected word line so as to obtain the same inhibit S/D voltage in the region where the gate length is 0.2 $\mu$m or less was slightly increased as the gate length became shorter. Contrary to this, in the non-selected cell C, as shown in FIG. 7, the inhibit gate voltage which can be supplied to the non-selected word line tended to slightly increase as the gate length became shorter. This shows that the directions of increase of the allowable range of the inhibit gate voltage coincide between the non-selected cell B and the non-selected cell C. Accordingly, it was confirmed from this result that in the 0.18 μm gate length Lg generation and on, the margin of the allowable range of the range of the gate bias voltage supplied to the non-selected word line so as to increase the allowable range of the inhibit S/D voltage of the non-selected cell B and the inhibit gate voltage range not lowering the program disturb characteristic of the non-selected cell C was not reduced as the gate length became shorter.

From the above, it was confirmed by experiments that the program inhibit voltage margin on the short gate length side where the gate length Lg is shorter than 0.2 μm was greatly improved by supplying for example a positive bias voltage to the non-selected word line and that the reliability of the write operation of a MONOS type memory cell having a gate length Lg of at least 0.18 μm was improved.

The inventors similarly studied a MONOS type memory cell having a gate length of 0.13 μm and as a result obtained the finding that it was basically possible to improve the program inhibit voltage margin in the same way as the 0.18 μm generation.

Figure 8:
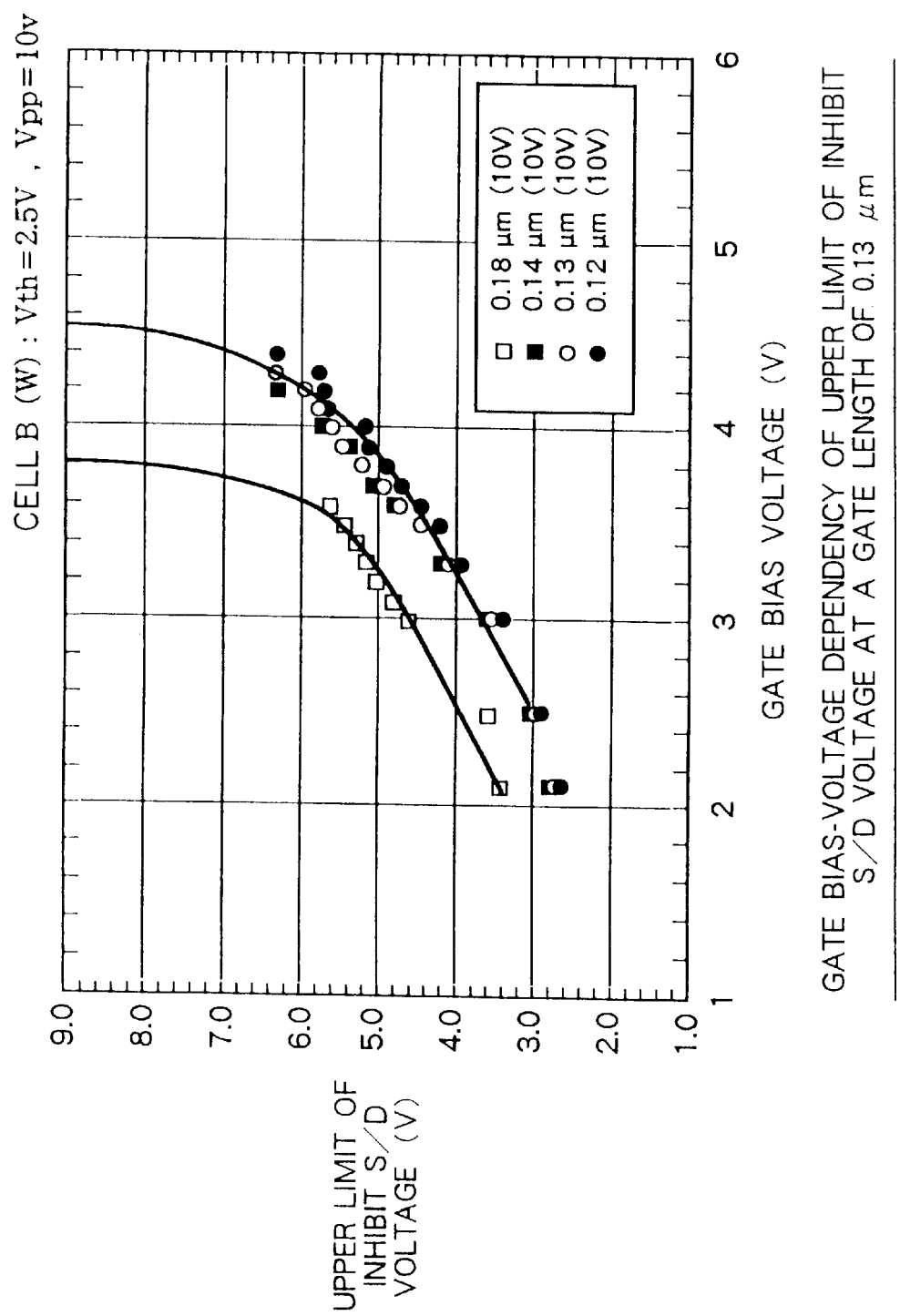
FIG. 8 is a graph of the relationship between the inhibit S/D voltage and the gate voltage compared with the generation of the gate length of 0.18 $\mu$m in the first embodiment of the present invention.

As one example thereof, FIG. 8 is a view of the relationship of the upper limit of the inhibit S/D voltage (threshold voltage Vth of the write state=2.5 V) and the gate bias voltage compared with the 0.18 μm generation. The abscissa shows the gate bias voltage, while the ordinate shows the inhibit S/D voltage. The curve of hollow squares shows the characteristic when the gate length Lg is 0.18 μm, the curve of solid squares shows the characteristic when the gate length Lg is 0.14 μm, the curve of hollow circles shows the characteristic when the gate length Lg is 0.13 μm, and the curve of solid circles shows the characteristic when the gate length Lg is 0.12 μm.

In the 0.13 μm gate length Lg generation, in comparison with the 0.18 μm gate length Lg generation, the parameters of the transistor for overcoming the various problems due to the short channel effect differ according to the design values. Particularly, in a transistor of 0.13 μm gate length Lg generation, the impurity concentration of the channel forming region is made higher. However, the basic tendency of the graph shown in FIG. 8, that is, the increase of the upper limit of the inhibit S/D voltage together with the gate voltage, is the same between the 0.13 μm generation and the 0.18 μm generation. Note that the gate voltage with which the upper limit of the inhibit S/D voltage becomes 7.5 V or more is 4.5 V in the 0.13 μm generation or increased from the value in the 0.18 μm generation (3.7 V). This is because the channel length becomes shorter in the 0.13 μm generation, therefore the channel forming region becomes more easily depleted with respect to the inhibit S/D voltage.

Figure 9:
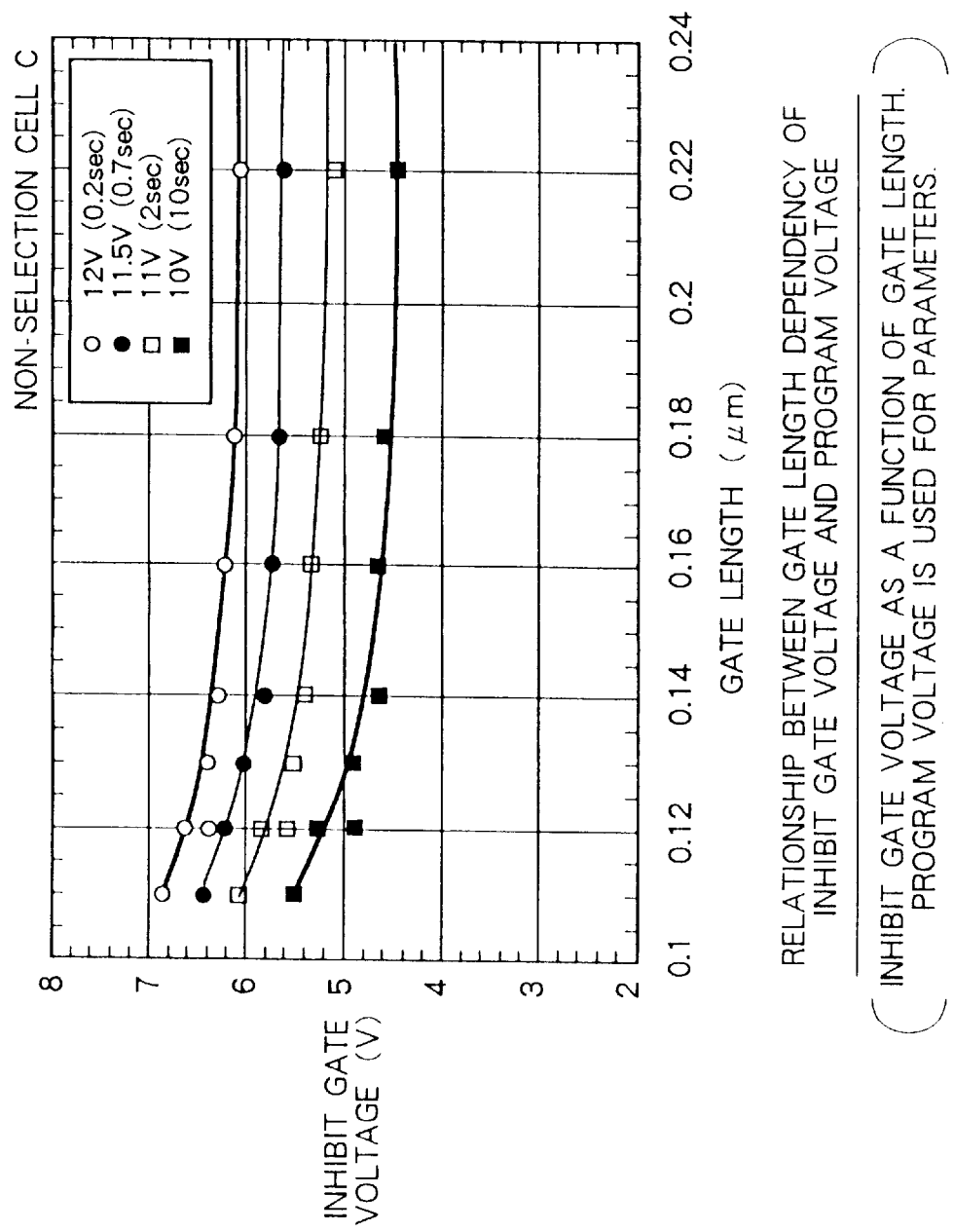
FIG. 9 is a graph of the gate length dependency of the inhibit gate voltage with a programming voltage in the first embodiment of the present invention as a parameter.

FIG. 9 is a graph of shows the gate length dependency of the inhibit gate voltage when the programming voltage is used as a parameter. The abscissa shows the gate length Lg, while the ordinate shows the inhibit S/D voltage. The curve of hollow circles shows the characteristic when the programming voltage is 12 V, the curve of solid circles shows the characteristic when the programming voltage is 11.5 V, the curve of hollow squares shows the characteristic when the programming voltage is 11 V, and the curve of solid squares shows the characteristic when the programming voltage is 10 V. The inhibit gate voltage is 5 V (programming voltage: 10 V) or 6 V (programming voltage: 11.5 V) when the gate length is 0.13 μm. It was seen that there was a sufficient margin with respect to the voltage 4.2 V (programming voltage: 10 V) and the voltage 4.5 V (programming voltage: 11.5 V) supplied to the non-selected word line.

From the above, it could be proved that the present embodiment can be sufficiently applied also in the 0.13 μm gate length generation. Further, it was seen that a sufficient margin could be obtained between the gate application voltage with which the upper limit of the inhibit S/D voltage becomes 7.5 V and the inhibit gate voltage. Further, it was found that the margin of the inhibit S/D voltage could be sufficiently obtained in practice even if the present invention is applied in a further finer gate length region of for example 0.10 μm.

[Relationship of Disturbance Characteristic and Programming Speed of Non-selected Cell A]

Next, the inventors studied the relationship of the disturbance characteristic and the programming speed of the non-selected cell A.

Figure 10:
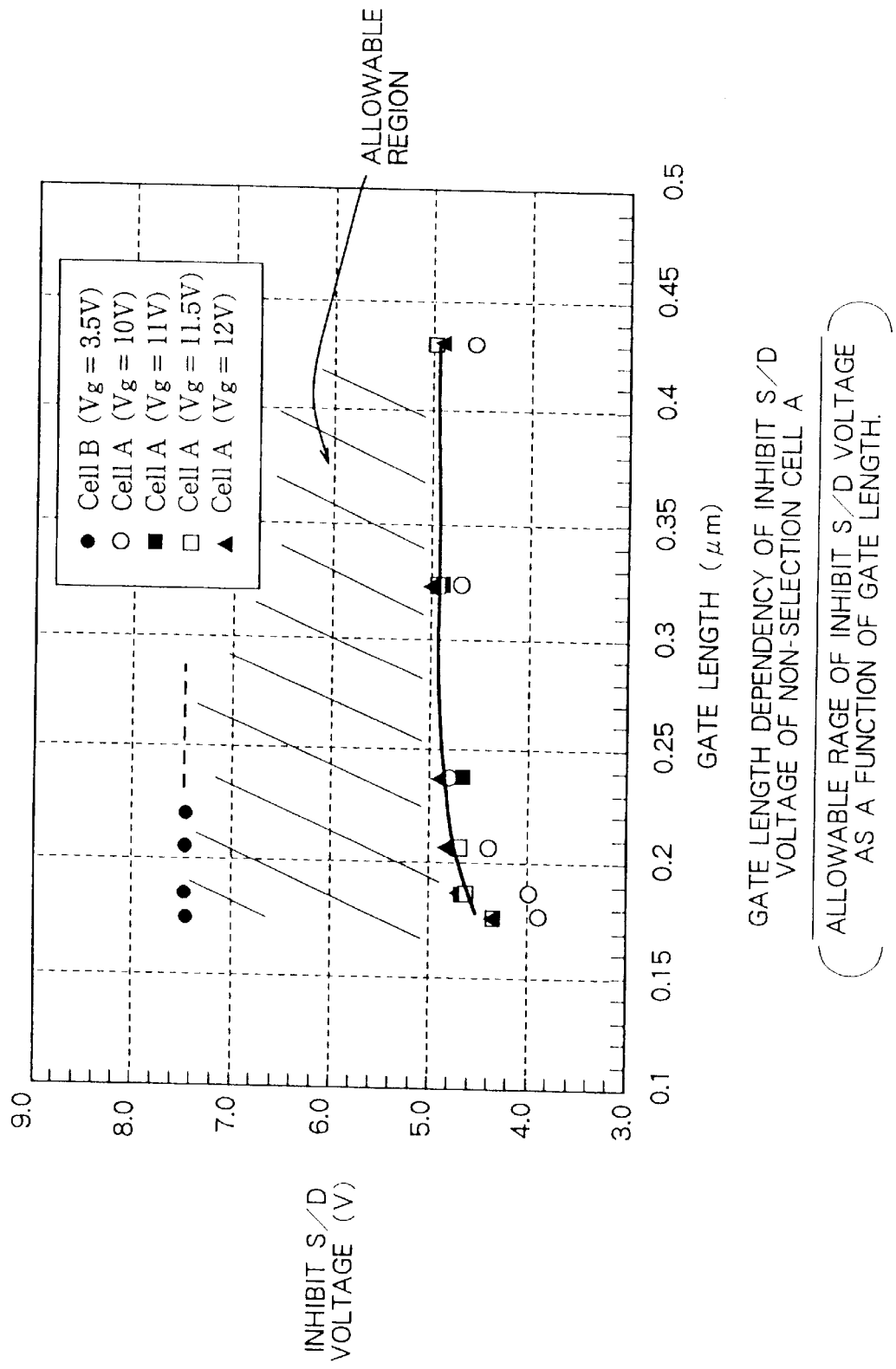
FIG. 10 is a graph of the gate length dependency of the inhibit S/D voltage where the gate bias voltage (programming voltage) of the non-selected cell A limiting the margin of the programming disturbance characteristic in the first embodiment of the present invention is used as a parameter.

As shown in FIG. 3, the lower limit of the inhibit S/D voltage is determined by the programming voltage. FIG. 10 is a view of the gate length dependency of the inhibit S/D voltage when the gate bias voltage (programming voltage) of the non-selected cell A was used as a parameter. The abscissa shows the gate length Lg, while the ordinate shows the inhibit S/D voltage. It was found that when the programming voltage is changed from 10 V (curve of hollow circles) to 12 V (curve of triangles), the lower limit of the inhibit S/D voltage did not change much at all at 11 V or more and was less than 5 V at all gate lengths within this range of programming voltages. On the other hand, it was found that the upper limit of the inhibit S/D voltage is restricted by the non-selected cell B and that the inhibit S/D voltage increases up to 7.5 V or more when a positive voltage (3.5 V) is supplied to the non-selected word line. Accordingly, it was found that the margin of the allowable inhibit voltage disturbance of the non-selected cell could be sufficiently secured even if the programming voltage was made 12 V. The write time (pulse application time) when the programming voltage at the time of measurement is made 12 V is 0.1 ms, accordingly it was learned that a good disturb characteristic could be expected even in high speed writing in a short programming time such as 0.1 ms.

Figure 11:
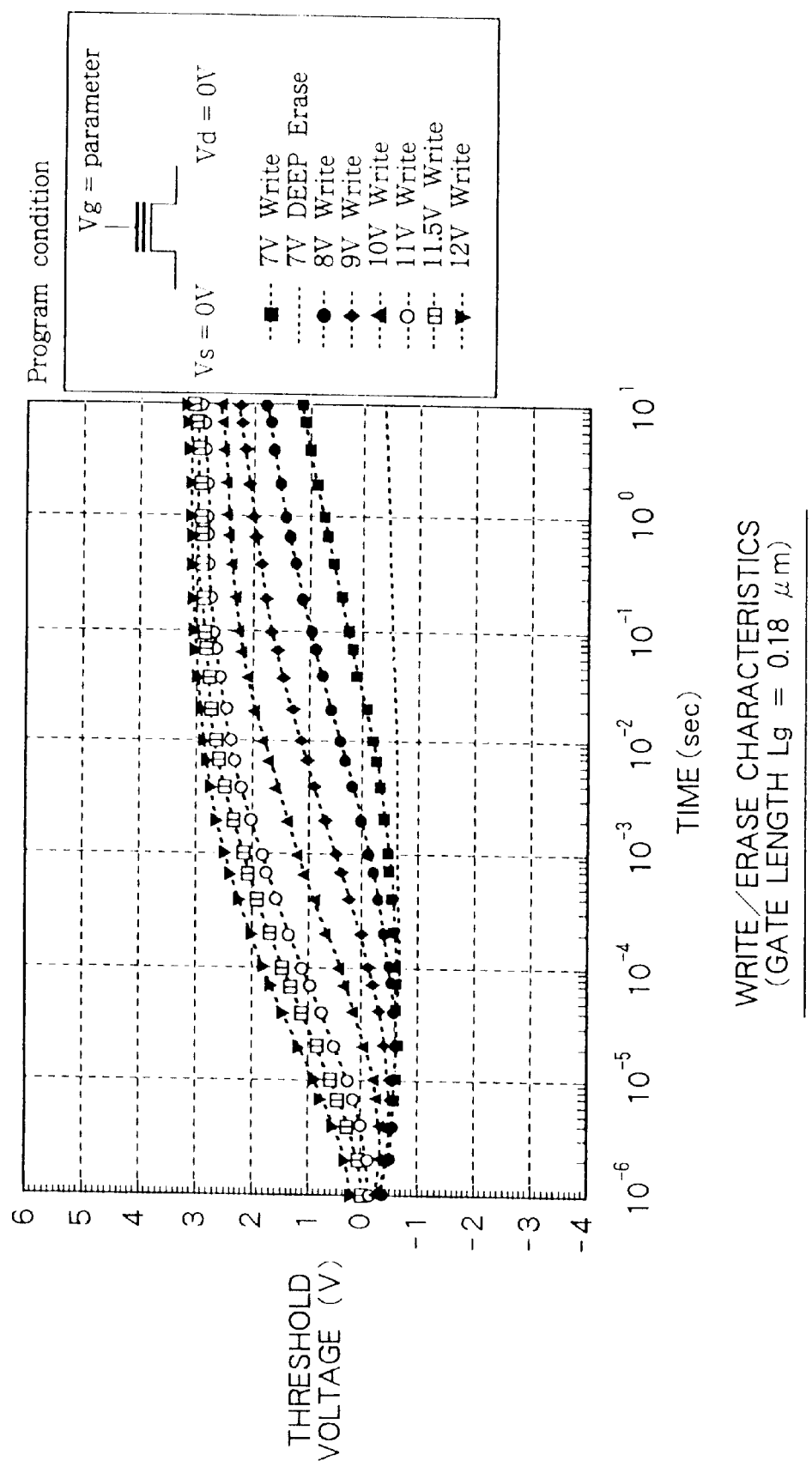
FIG. 11 is a graph of a write/erase characteristic of the nonvolatile memory shown in FIG. 1 according to the first embodiment of the present invention.

FIG. 11 is a graph of the write/erase characteristic of this nonvolatile memory. The abscissa shows the time by a logarithmic scale, while the ordinate shows the threshold voltage. The gate length Lg at this time is 0.18 μm. The curves show the write characteristics in the write operation modes shown at the right side of FIG. 11.

Figure 12:
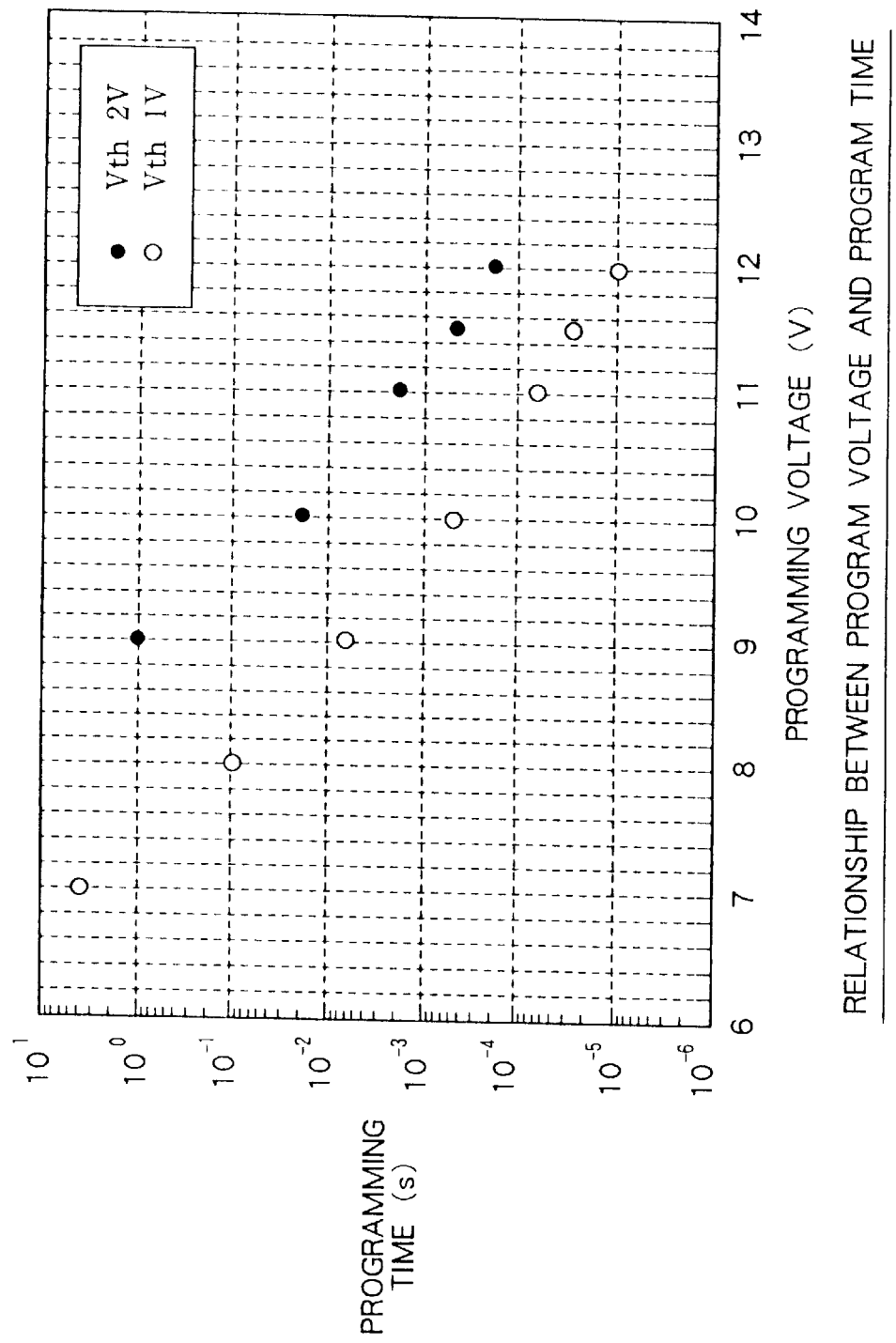
FIG. 12 is a graph of the relationship between the programming voltage and a programming time when the threshold voltage is 1 V and 2 V based on the data read from FIG. 11.

FIG. 12 shows the relationship of the programming voltage and the programming time when the threshold voltage Vth is 1 V and 2 V based on the data in FIG. 11. The abscissa shows the programming voltage, while the ordinate shows the programming time. The curve of solid circles shows the characteristic when the threshold voltage Vth is 2 V, while the curve of solid circles shows the characteristic when the threshold voltage Vth is 1 V.

From the illustration of FIG. 12, it is seen that the programming speed can be shortened by 1 order in a MONOS type nonvolatile memory, in other words, becomes about 1/10, just by increasing the programming voltage by 1 V. Accordingly, it was found that the write speed could be shortened by about 2 orders (shortened to 1/100) by changing the programming voltage from 10 V to 12 V. Such a conspicuous effect is not seen in the FG type, therefore it is one of the great advantages resulting from the improvement of the disturb characteristic according to the present invention.

Above, an explanation was given of the evaluation of the characteristics and results of the study of the disturb characteristic according to an embodiment of the present invention. Other than this, in the present invention, it is necessary to investigate if there is a problem in the voltage tolerance (voltage tolerance of the junction) when the source and drain are reverse biased and to also confirm the principal device characteristic.

[Break Down Properties of Memory Transistor]

Figure 13:
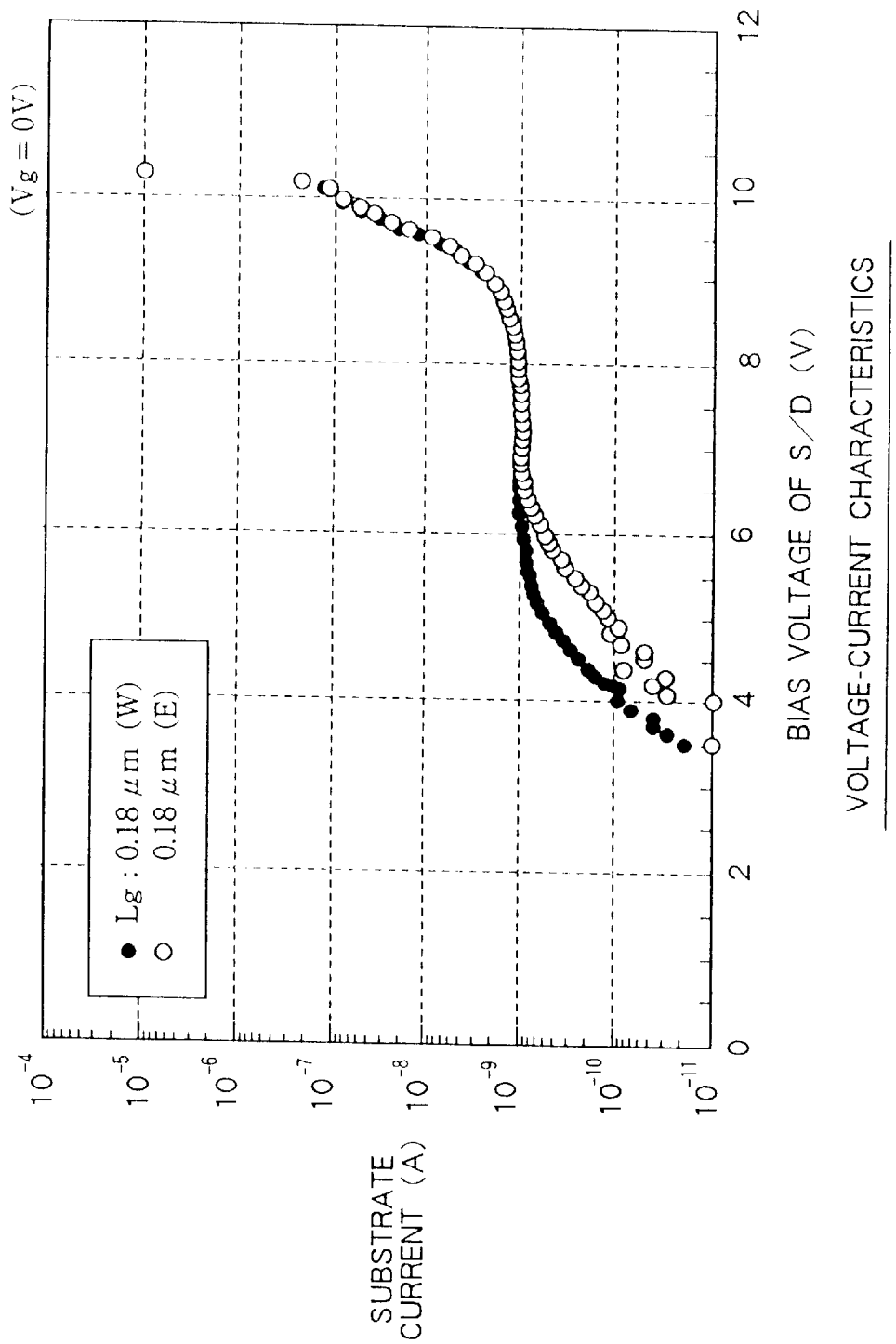
FIG. 13 is a graph of both of the cases of the write state and erase state for a current-voltage characteristic in the case of a gate voltage of 0 V in the first embodiment of the present invention.

FIG. 13 is a graph of the current-voltage characteristic where the gate voltage Vg is 0 V for both the case of the write state and erase state. The abscissa shows the bias voltage of S/D, while the ordinate shows the substrate current. The curve of hollow circles shows the characteristic of a written state (W) when the gate length Lg is 0.18 µm, while the curve of solid circles shows the characteristic of an erased state (E) when the gate length Lg is 0.18 µm.

It was found from the results illustrated that the breakdown voltage of the junction was about 10 V and did not depend upon the written state and erased state. However, it is found that the rising voltage in the sub-breakdown region where the S/D bias voltage is near 3 V to 5 V is different between the written state and the erased state.

Figure 14:
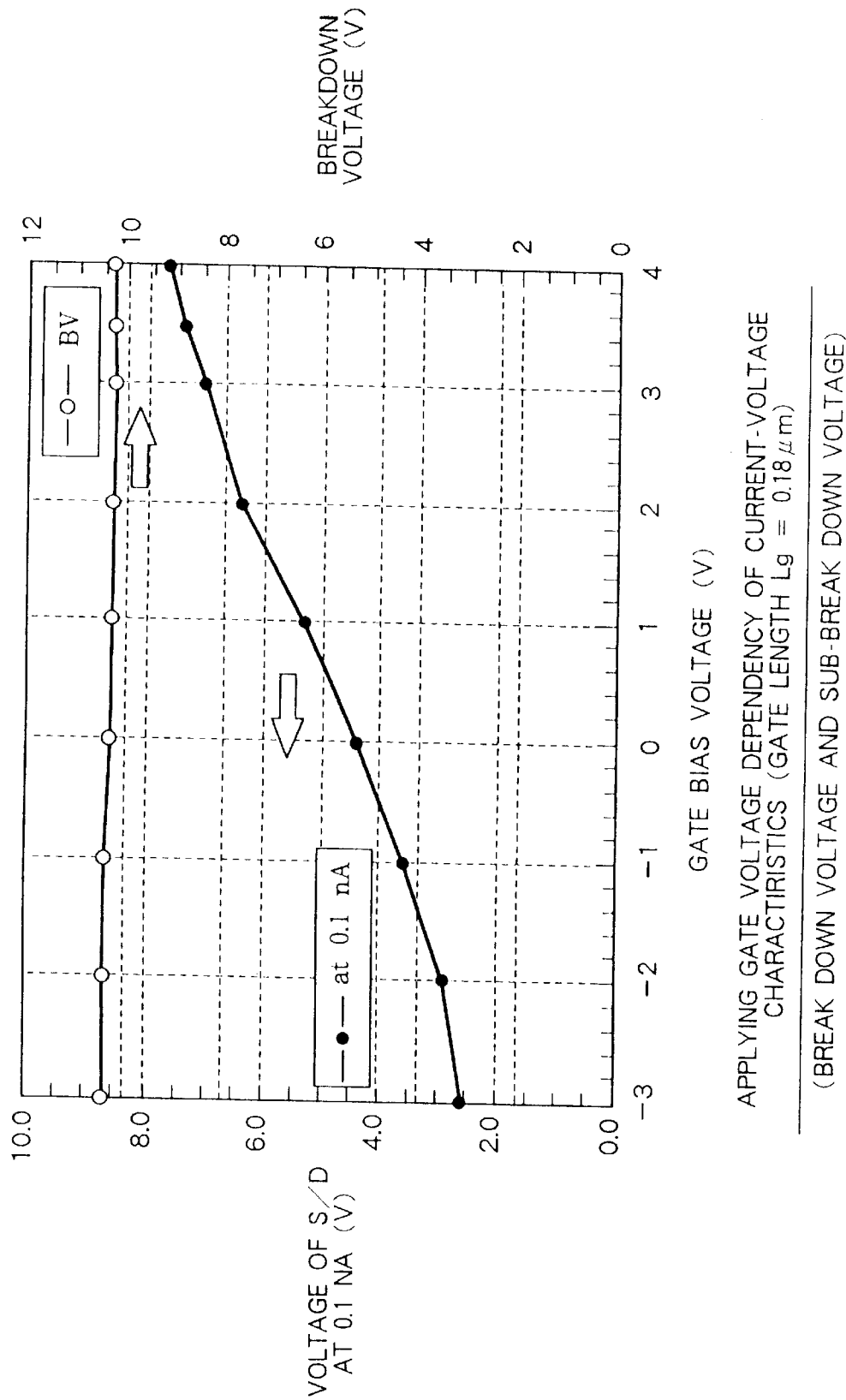
FIG. 14 is a graph of the gate voltage dependency of the current-voltage characteristic in the write state in the first embodiment of the present invention.

FIG. 14 illustrates the gate voltage dependency of the current-voltage characteristic in the written state. The abscissa shows the gate bias voltage. The ordinate on the left side shows the source/drain (S/D) voltage at 0.1 nA, and the curve of solid circles shows the S/D voltage. The ordinate on the right side shows the breakdown voltage, and the curve of hollow circles shows the breakdown voltage.

From the illustration of FIG. 14, it is found that the breakdown voltage indicated by the curve of hollow circles did not exhibit any gate voltage dependency, while the rising voltage in the sub-breakdown region where the S/D bias voltage was shown to be a value near 3 V to 5 V in FIG. 13 exhibited gate voltage dependency. It is believed that the sub-breakdown region is due to the Band-to-Band tunnel phenomenon at the surface of the drain/source region of the gate edge portion, but in this example, the current level is very small, i.e., about 0.1 nA, therefore it is considered that there is no problem here. Further, it is considered that a breakdown voltage of about 10 V does not directly influence the write inhibit characteristic since the upper limit of the inhibit S/D voltage is about 7.5 V. It was found from the above that, in a 0.18 µm MONOS type memory transistor, the voltage tolerance of the junction thereof did not become a factor limiting the programming disturb characteristic.

[Principal Device Characteristics]

Figure 15:
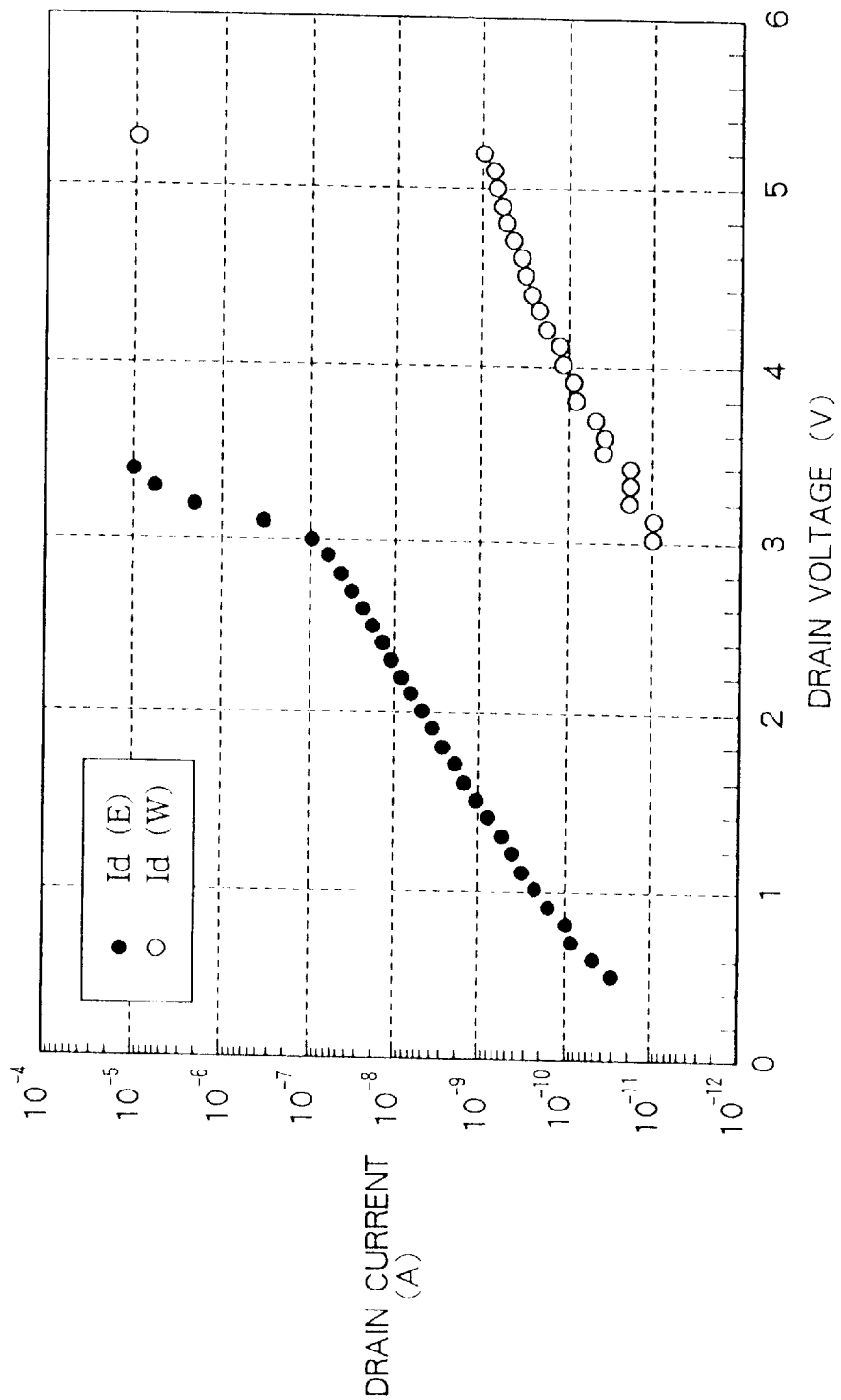
FIG. 15 is a view of the current-voltage characteristic in the write state and erase state in the first embodiment of the present invention.

FIG. 15 shows the current-voltage characteristic in the written state and erased state. The curve of solid circles shows erased state characteristic, while the curve of hollow circles shows the write written state characteristic. The abscissa shows the drain voltage, while the ordinate shows the drain current.

When the gate voltage is 0 V, the current of the non-selected cell at the drain voltage of 1.5 V was about 1 nA. Since the read current in this case is 10 µA or more, it is considered that erroneous reading of a non-selected cell will not occur. Accordingly, it was found that the margin of the punch-through voltage tolerance at the time of a read operation was sufficient in a MONOS type memory transistor having a gate length of 0.18 µm. Further, the read disturbance characteristic at a gate voltage of 1.5 V was evaluated, whereby it was found that 10 years read time of $3 \times 10^8$ sec or more was possible.

Figure 16:
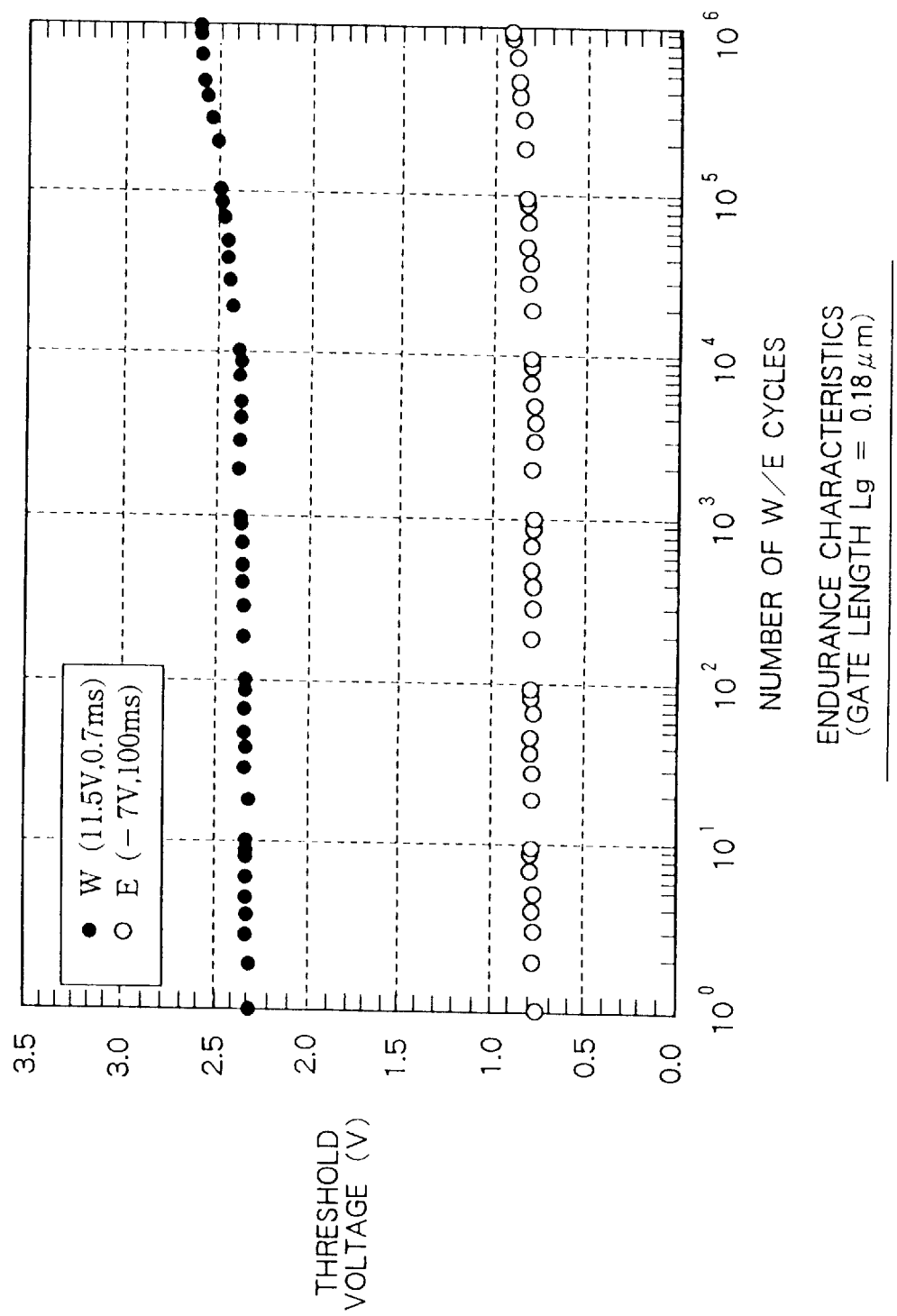
FIG. 16 is a view of the endurance characteristic under predetermined write and erase conditions in the first embodiment of the present invention.

FIG. 16 shows the Endurance characteristic under the write conditions (programming voltage: 11.5 V, programming time: 0.7 msec) and erase conditions (gate voltage at erasing: −7 V, erasing time: 100 msec). The abscissa shows the number of times of writing/erasing, while the ordinate shows the threshold voltage Vth. The curve of solid circles shows the write characteristic, while the curve of hollow circles shows the erase characteristic.

It was found from the illustration of FIG. 16 that it was little Vth narrowing up to $10^6$ W/E cycles since the carrier traps are spatially (planarly) dispersed. Further, the data retention characteristic was at least 10 years at 85° C. after $1 \times 10^6$ W/E cycles.

It could be confirmed from the above that a sufficient characteristic could be obtained for a 0.18 µm generation MONOS type nonvolatile memory transistor.

Below, a description will be made of a fine NOR type cell structure as the example of the cell structure to which the present invention can be applied and of an example of the cell method in which bit lines and/or source lines are formed in layers.

[Fine NOR Type Cell Using Self-Alignment Technique and Meandering Source Lines]

Figure 17:
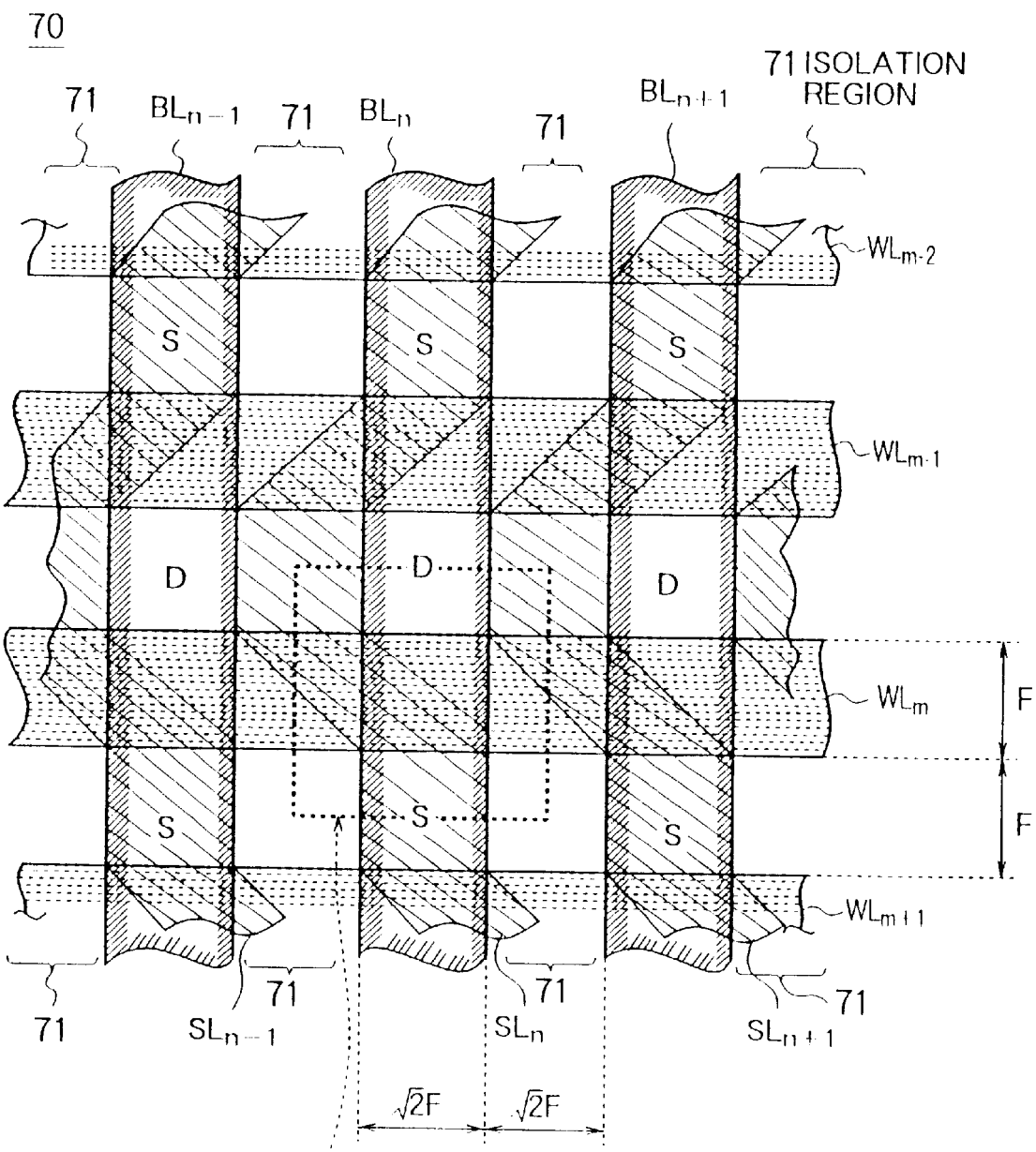
FIG. 17 is a schematic plan view of a fine structure NOR type cell using a self-aligned technique and a meander source line as the example of the cell structure to which the first embodiment of the present invention can be applied.

FIG. 17 is a schematic view of a fine NOR type cell array using a self-aligned fabrication technique and winding source lines.

In the fine NOR type cell array 70 illustrated in FIG. 17, trenches or LOCOS isolations or other element-isolation regions 71 are arranged in the bit direction (vertical direction of FIG. 17) at equal intervals on the surface of p-well. Word lines $WL_{m-2}$, $WL_{m-1}$, $WL_m$, and $WL_{m+1}$ are arranged at equal intervals substantially orthogonally to the element-isolation regions 71. This word line structure is formed by for example stacked layers of the tunnel insulating film, nitride film, top oxide film, and gate electrode in the same way as FIG. 1.

At the periphery of each word line, just forming a side wall, a contact hole for the bit line connection and a contact hole for the source line connection are formed for the source region and the drain region while simultaneously using the self-aligned contact technique twice. In addition, the above process does not require a photomask. Accordingly, as previously mentioned, in addition to the fact that the size and arrangement of source regions and drain regions are uniform, the sizes of the contact holes for the bit line or source line connection formed by self-aligned technique with respect to this become extremely uniform. Further, the contact holes have almost the maximum limit of size with respect to the surface area of the source region and the drain region.

Further, the source lines $SL_{n-1}$, $SL_n$ and $SL_{n+1}$ arranged in the bit direction are arranged while winding above the element-isolation regions 71 and source regions while avoiding the drain regions and are connected to the source regions of the lower layer via the contact holes for the source line connection. On the source lines, bit lines $BL_{n-1}$, $BL_n$, and $BL_{n+1}$ are arranged at equal intervals via a second inter-layer insulating film. These bit lines are located above the active region and are connected to the drain regions of the lower layer via the contact holes for the bit line connection.

In a cell pattern having such a structure, as described above, the mask alignment does not have much of an effect upon the formation of the source regions and the drain regions. Further, the contact holes for the bit line connection and the contact holes for the source line connection are formed all at once by using the self-aligned fabrication technique twice. Therefore, the contact holes do not become elements limiting the reduction of the cell area, the source interconnections etc. can be formed with the minimum feature size F of the limit of the wafer process, and there is almost no wasted space. Therefore, a very small cell area near $6F^2$ can be realized.

Note that in this cell structure as well, the operation for reducing write and/or erase inhibit disturb of a non-selected cell according to the present embodiment described above is applied. Namely, a positive bias voltage is supplied to a non-selected word line at the time of programming and a voltage of the reverse bias in the polarity with respect to the channel forming region is supplied to the non-selected bit line/source line and then the programming voltage is supplied to the selected word line.

[NOR Type Cell in Which Bit Lines and/or Source Lines Are Formed in Layers]

Figure 18:
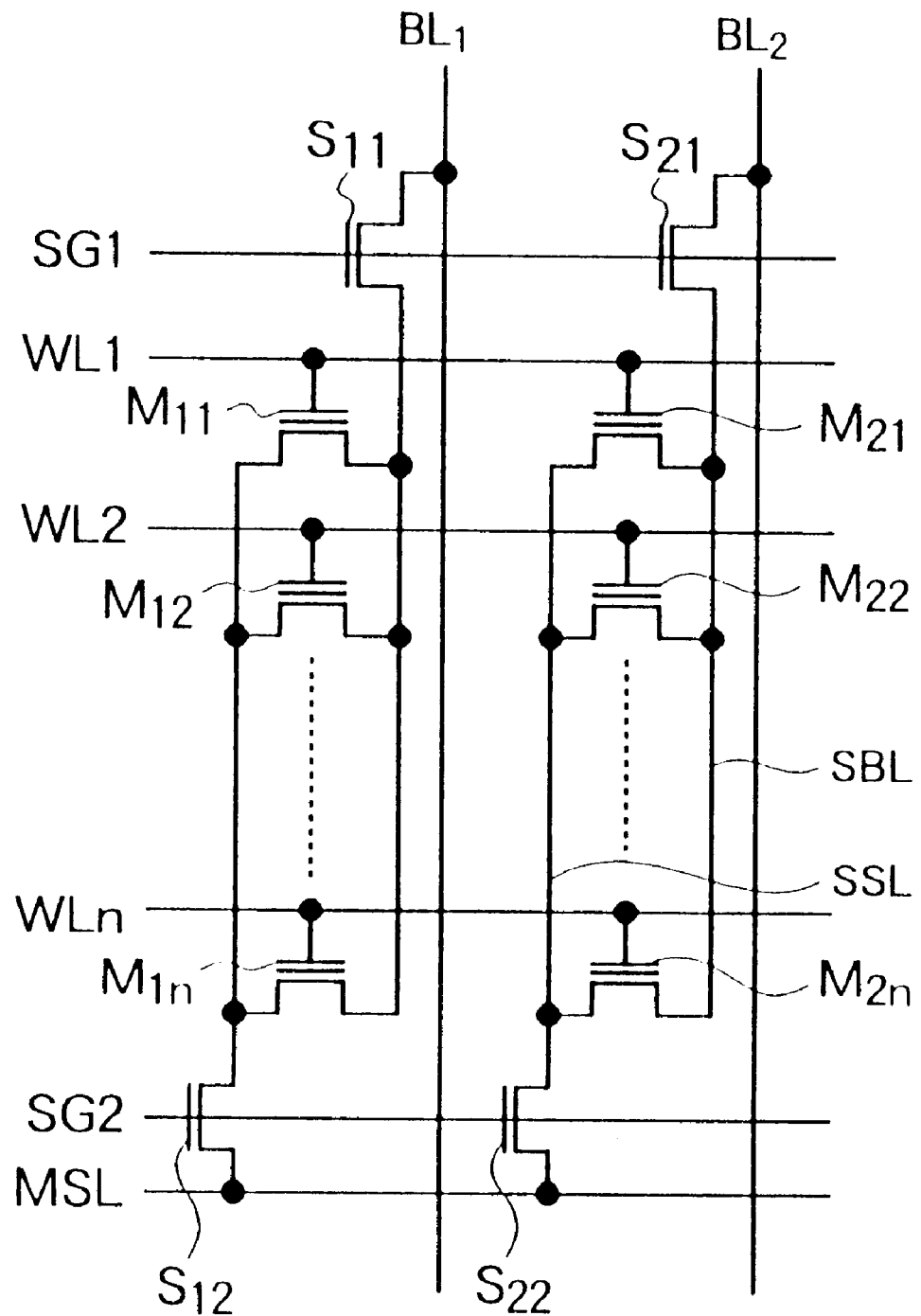
FIG. 18 is a circuit diagram of a NOR type cell array in which bit lines and source lines are arranged in different layers as an example of a cell method to which the first embodiment of the present invention can be applied.

FIG. 18 is an example of a circuit diagram of a fine NOR type cell array of the isolated-source type in which bit lines and source lines are formed in a layered structure.

A unit is constituted by a plurality of unit cell transistors $M_{11}$ to $M_{1n}$ or $M_{21}$ to $M_{2n}$ inserted (connected or coupled) in parallel between a sub-bit line SBL and a sub-source line SSL and two selection transistors $S_{11}$, $S_{12}$ or $S_{21}$, $S_{22}$ for respectively connecting sub-interconnections SBL and SSL to main interconnections (bit lines $BL_1$ and $BL_2$ or the source line $SL_1$ and $SL_2$).

The characteristic feature of this circuit resides in that, first, the bit lines and the source lines are classified into main and sub lines; second, the circuit has a pseudo contact-less structure where the sub-interconnections are constituted by a diffusion layer; and, third, full channel write and full channel erase operations are adopted.

Looking at the formation of layers of interconnections, the selection transistor $S_{11}$ or $S_{21}$ on the drain side separates the non-selected unit from the main bit lines $BL_1$ and $BL_2$. Therefore, the static capacitance of the main bit lines is remarkably reduced. This is advantageous for the increase of speed and reduction of the power consumption. Further, the selection transistor $S_{12}$ or $S_{22}$ on the source side act to enable a reduction of the static capacitance by separating the sub-source line SSL from the main source line MSL.

Further, by adopting the pseudo contact-less structure, the unit surface area of the NOR type cell can be made smaller.

Further, by using the trench separation technique and self-alignment technique (for example, self-alignment contact formation technique used in fine NOR type cells), $6F^2$ (F is the smallest design rule) can be achieved. The sub-bit line SBL or the sub-source line SSL is formed by the diffusion layer or a diffusion layer to which a silicide layer is laminated. Metal interconnections are used for the main bit lines $BL_1$ and $BL_2$.

By using full channel write/erase operations, it is not necessary to use a double diffusion layer structure for suppressing the Band to Band tunneling in the drain or source diffusion layer. Therefore, in comparison with the operation for draining a stored charge from the diffusion layer, the scaling property of the source/drain diffusion layer of the memory transistor is excellent. As a result, the fine scaling characteristic of the cell is excellent, therefore a memory transistor having a finer gate length can be realized.

In a cell of this circuit structure as well, the operation of reducing write and/or erase inhibit disturb of a non-selected cell according to the present embodiment described above is substantially identically applied. Namely, a positive bias voltage is supplied to the non-selected word line at the time of programming and in that state an inhibit S/D voltage which becomes a reverse bias in the polarity with respect to the channel forming region is supplied to the main bit line and the programming voltage is supplied to the selected word line.

In this circuit structure, the sub-source line SSL is made electrically floating in the writing operation.

Note that the present embodiment can also be applied to other structures in which bit lines or source lines are formed in layers, for example, the DINOR type and the fine NOR type cell referred to as an HiCR type constituted by an isolated-source type cell array where two adjoining sources regions make common use of a source line.

In the first embodiment, it could be confirmed by experiments in 0.18 μm generation MONOS type nonvolatile memories that the upper limit of the inhibit S/D voltage of the non-selected cell B connected to both of the non-selected word line and non-selected bit line could be increased and the allowable inhibit voltage margin could be improved by applying for example a positive bias voltage to the non-selected word line. The gate length dependency of this effect was also investigated. As a result, it was found to be particularly effective in the region where the gate length is shorter than 0.2 μm. It could be proved from various experimental data that this effect of improvement was obtained due to the facts that, in the conventional case of a gate voltage of 0 V, the channel forming region was depleted due to the reverse bias voltage and therefore the electric field component in the vertical direction in which the charge held in the ONO film was emitted to the substrate side in the channel forming region of the transistor increased and that this gate voltage can be reduced by application of a voltage biased in the reverse bias direction (positive direction in the present embodiment) with respect to the channel forming region. It was found that an increase of the upper limit of this inhibit S/D voltage improved the allowable inhibit voltage margin of the non-selected cell A connected to the same non-selected bit line. Further, the inventors investigated the voltage tolerance of the transistor by experiments and as a result found that the voltage tolerance of the transistor was larger than the inhibit S/D voltage and did not become a factor limiting the programming inhibit characteristic. It was also confirmed that there was no influence upon the principal device characteristics. The data showing the increase of the allowable inhibit voltage margin can also be applied to a 0.18 μm generation and below MONOS type memory transistor in terms of principle.

According to the first embodiment, it was learned that the programming disturb characteristic, particularly the margin of the allowable inhibit S/D voltage, can be sufficiently obtained by the increase even if the programming voltage is increased from the usual 10 V to 12 V and that this enabled an increase in the write speed. In the case of the MONOS type, the write speed can be shortened by about 1 orders by an increase of 1 V. Accordingly, by increasing the programming voltage from 10 V to 12 V, the write speed can be shortened by about 2 orders.

According to the first embodiment, such an improvement of the programming disturb facilitates the realization of a one-transistor cell, that is, a memory cell using just a single transistor. For realization of this, it is necessary to use an enhanced type memory cell where the threshold voltage of the memory transistor is not become depleted, but the tunnel insulating film can be made thicker if the programming speed is the same since there is greater leeway for increasing the programming voltage. As a result, the data retention characteristic and read disturb characteristic are enhanced. In this respect as well, it becomes easy to realize a one-transistor cell.

In a one-transistor cell, since it is not necessary to provide a selection transistor for every memory cell, it is possible to reduce the costs due to the reduction of cell area and consequently to reduce the chip area and enlarge the capacity. As a result, it becomes possible to realize a large capacity MONOS type nonvolatile memory having a cell area equivalent to that of the NOR type, AND type, NAND type, or DINOR type of an FG type nonvolatile memory at low cost.

Further, since the tunnel insulating film is relatively thicker, the injection of holes into the charge storing means is suppressed. As a result, the deterioration of the tunnel insulating film due to hole injection is suppressed, so the repeated write and erase characteristic (endurance characteristic) is improved.

Note that, it is also possible to use the write inhibit voltage supplying circuit of the present example when performing an enhancement operation by reading the information in a state where the source region is reverse biased. In this sense as well, the one-transistor structure is facilitated.

Modification of First Embodiment

In the nonvolatile semiconductor memory element of the first embodiment illustrated in FIG. 1, preferably an oxynitride layer 10a is provided on the surface of the tunnel insulating film 10, but the provision of the oxynitride layer 10a is not indispensable in the present invention. It is also possible to omit this. When an oxynitride layer 10a is not provided, the tunnel insulating film 10 becomes slightly thinner than the above value. Accordingly, the thickness of the tunnel insulating film 10 can be appropriately selected within a range of from 2.0 nm to 3.0 nm in accordance with the purpose of use.

Second Embodiment

As a second embodiment of the present invention, a modification of a MONOS type nonvolatile semiconductor memory device will be shown.

Figure 19:
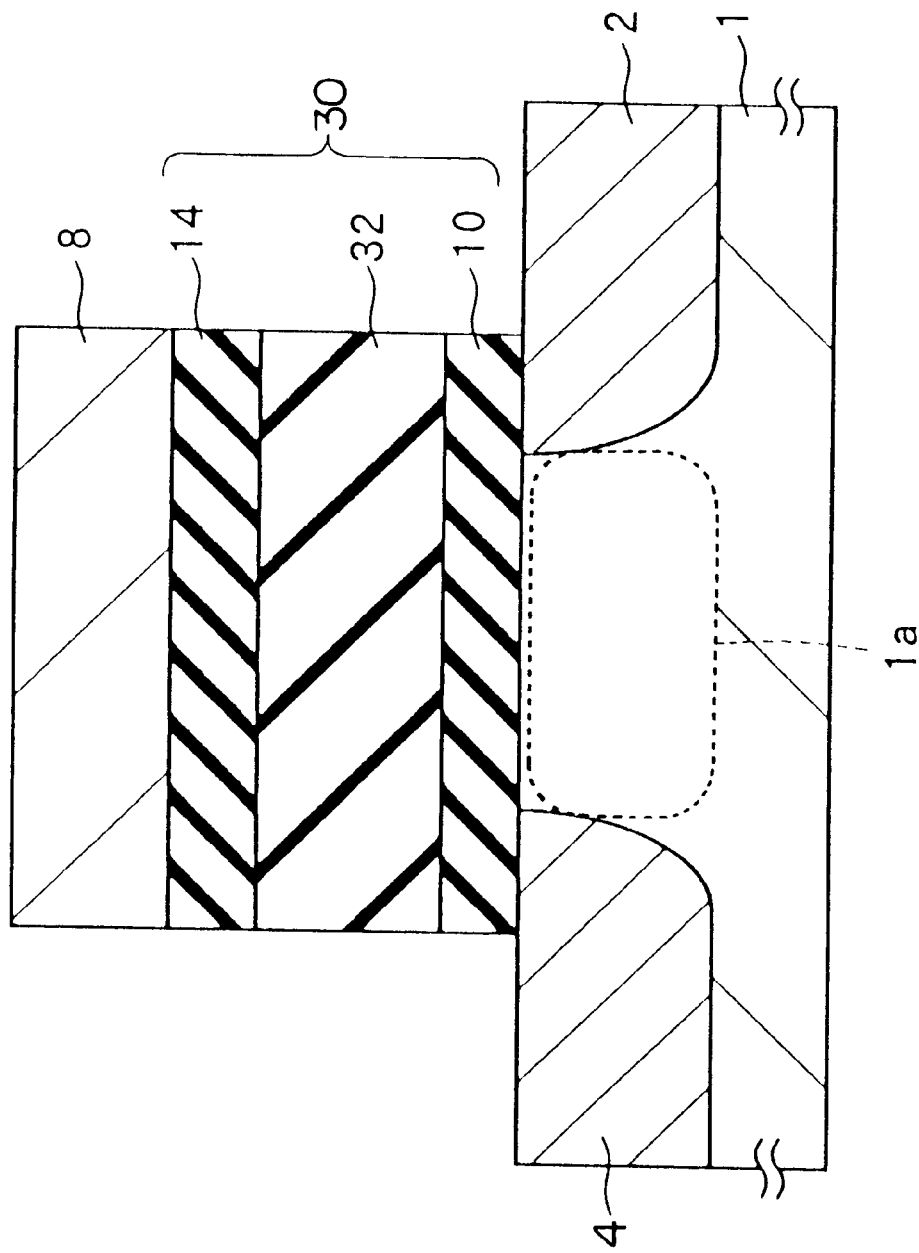
FIG. 19 is a sectional view of an element structure of a MONOS type memory transistor according to a second embodiment of the present invention.

FIG. 19 is a sectional view of the structure of a MONOS type memory transistor.

The difference between the MONOS type nonvolatile memory of the second embodiment and the first embodiment illustrated in FIG. 1 will be described below. The difference from the first embodiment resides in the fact that the gate insulating film 30 of the second embodiment is provided with an oxynitride film 32 ($SiO_xN_y$, 0<x<1, 0<y<1) in place of the nitride film 12 illustrated in FIG. 1. The rest of the structure, that is, the semiconductor substrate 1, source region 2, drain region 4, channel forming region 1a, tunnel insulating film 10, top oxide film 14, and gate electrode 8, are substantially the same as those of the first embodiment. Note that the tunnel insulating film 10 in the present example does not have the oxynitride layer 10a (FIG. 1) on the surface. Of course, as mentioned above, the oxynitride layer 10a can be omitted from the surface of the tunnel insulating film 10 in the first embodiment as well. Accordingly, the lack of the oxynitride layer 10a is not the characteristic feature of the second embodiment.

The oxynitride film 32 has a thickness of for example 5.0 nm. Further, the tunnel insulating film 10 in the present example is slightly thinner than that of the first embodiment since it does not have the oxynitride layer 10a. The thickness can be appropriately selected within the range of from 2.0 nm to 3.0 nm in accordance with the purpose of use. In the second embodiment, a thickness of about 2.5 nm was adopted. The same is true in the case where $SiO_2$ is used for the tunnel insulating film in the first embodiment.

In the manufacture of a memory transistor of such a structure shown as the second embodiment, after the formation of the tunnel insulating film 10, the oxynitride film 32 is stacked thicker than 5.0 nm by for example the row pressure CVD process to give a final thickness of 5.0 nm. This CVD is carried out using a gas obtained by mixing for example dichlorosilane (DCS), ammonia, and $N_2O$. In the same way as the first embodiment, it is preferred that, in the formation of the $SiO_xN_y$ film on this thermally oxidized film, the pretreatment (wafer pretreatment) and film formation conditions of the underlying surface be optimized in advance according to need. After this, the top oxide film 14 and gate electrode material are formed and the electrodes are formed in the same way as the first embodiment to complete the MONOS type memory transistor.

The circuit structure shown in FIG. 2 is applied as it is in the second embodiment as well. At the time of a write operation, in the same way as the first embodiment, a non-selected cell is reducing write and/or erase disturb by giving for example a positive voltage to the non-selected word line and a reverse bias voltage to the non-selected common line.

The inventors examined a MONOS type nonvolatile memory having such a structure for the programming disturb characteristic of the non-selected cells A and B. Namely, they investigated the gate length dependency of the allowable range of the inhibit S/D voltage and found the intensity of distribution of the electric field in the channel vertical direction by two-dimensional device simulation, whereby they obtained results similar to those in the first embodiment shown in FIG. 3 and FIG. 4. Further, they investigated the gate voltage dependency of the upper limit of the inhibit S/D voltage and as a result found that while FIG. 5 of the first embodiment could not be applied to this as it was, similar results were obtained. Namely, as the gate voltage becomes larger, the inhibit S/D voltage steadily increased. It abruptly increased from a certain gate voltage and had a weak gate length dependency.

Further, while the graph of the gate length dependency of the inhibit gate voltage of the non-selected cell C shown in FIG. 7 cannot be applied as it is to the present example, there is the same results that the inhibit gate voltage slightly increases in the short gate length region. Note that the average inhibit gate voltage was 4.4 V or slightly higher when compared with the first embodiment.

Next, the inventors investigated the voltage tolerance of the memory transistor.

While the results illustrated in the graphs of FIG. 13 and FIG. 14 showing the results of investigation of voltage tolerance in the first embodiment cannot be applied as they are in the second embodiment, in the same way as the first embodiment, the breakdown voltage of the junction was 10 V and did not depend upon the write state and erase state, the rising voltage in the sub-breakdown region near 3 V to 5 V was different between the write state and the erase state, the breakdown voltage did not exhibit any gate voltage dependency, and the rising current in the sub-breakdown region exhibited gate voltage dependency.

Next, the principal device characteristics will be described. In the second embodiment as well, while the results illustrated in FIG. 15 and FIG. 16 for the first embodiment cannot be applied as they are, similar values were obtained as the principal characteristic values. Namely, the read gate voltage of the data in the current-voltage characteristic was 1.5 V. At this time, the current at the drain voltage of 1.5 V in the non-selected cell is about 1 nA or not an extent where erroneous reading of the non-selected cell occurs. A reading time of $3 \times 10^8$ sec or more is possible from the read disturb characteristic, good endurance characteristics be obtained up to $10^6$ W/E cycles under write conditions similar to the first embodiment, and the data retention characteristic is at least 10 years at 85° C. after $1 \times 10^6$ W/E cycles.

From the above, it was confirmed that sufficient characteristics were obtained for a 0.18 μm generation MONOS type nonvolatile memory transistor.

Note that in the second embodiment as well, in the same way as the first embodiment, a fine NOR type cell having a small chip area (for example about $6F^2$ (F: the smallest design width)) can be realized by using a fine NOR type cell using the self-aligned technique and winding shaped source lines or a NOR type cell in which the bit lines and/or source lines are formed in layers.

Such a MONOS type nonvolatile memory according to the second embodiment exhibits a similar effect to that by the first embodiment. Namely, by applying for example a positive bias voltage to the non-selected word line, the upper limit of the inhibit S/D voltage of the non-selected cell B is increased. As a result, the allowable inhibit voltage margin of the non-selected cells A and B can be enlarged. This effect is particularly conspicuous in the region where the gate length is shorter than 0.2 μm and is achieved by the possibility of reduction of the electric field component in the channel vertical direction increased by channel depletion when the gate electrode is unbiased by the application of the gate bias voltage. Further, such a bias setting enables an increase of write speed (100 times) by increasing the programming voltage from the usual 10 V to 12 V without lowering the voltage tolerance of the transistor and the principal device characteristics. Further, the realization of a one-transistor cell is facilitated by the increase of the allowable inhibit voltage margin. The achievement of a one-transistor cell is facilitated also by the fact that a memory characteristic saturated by enhancement can be easily obtained. Due to this, it is possible to achieve a reduction of costs due to the reduction of the cell area and consequently a reduction of chip area and therefore an increase of capacity. Particularly, when using a fine NOR type cell formed using the self-aligned technique and winding shaped source lines or a NOR type cell in which the bit lines and/or source lines are formed in layers, the cell area can be made extremely small.

Further, since the tunnel insulating film is relatively thicker, the injection of holes into the charge storing means is suppressed and, as a result, the endurance characteristic is improved.

Third Embodiment

As a third embodiment of the present invention, a nonvolatile semiconductor memory device using a large number of Si nano-crystals embedded in the gate insulating film and insulated from each other as the charge storing means of the memory transistor (hereinafter referred to as an Si nanocrystal type) is shown. The Si nano-crystals preferably have a particle size of less than 10 nanometers.

Figure 20:
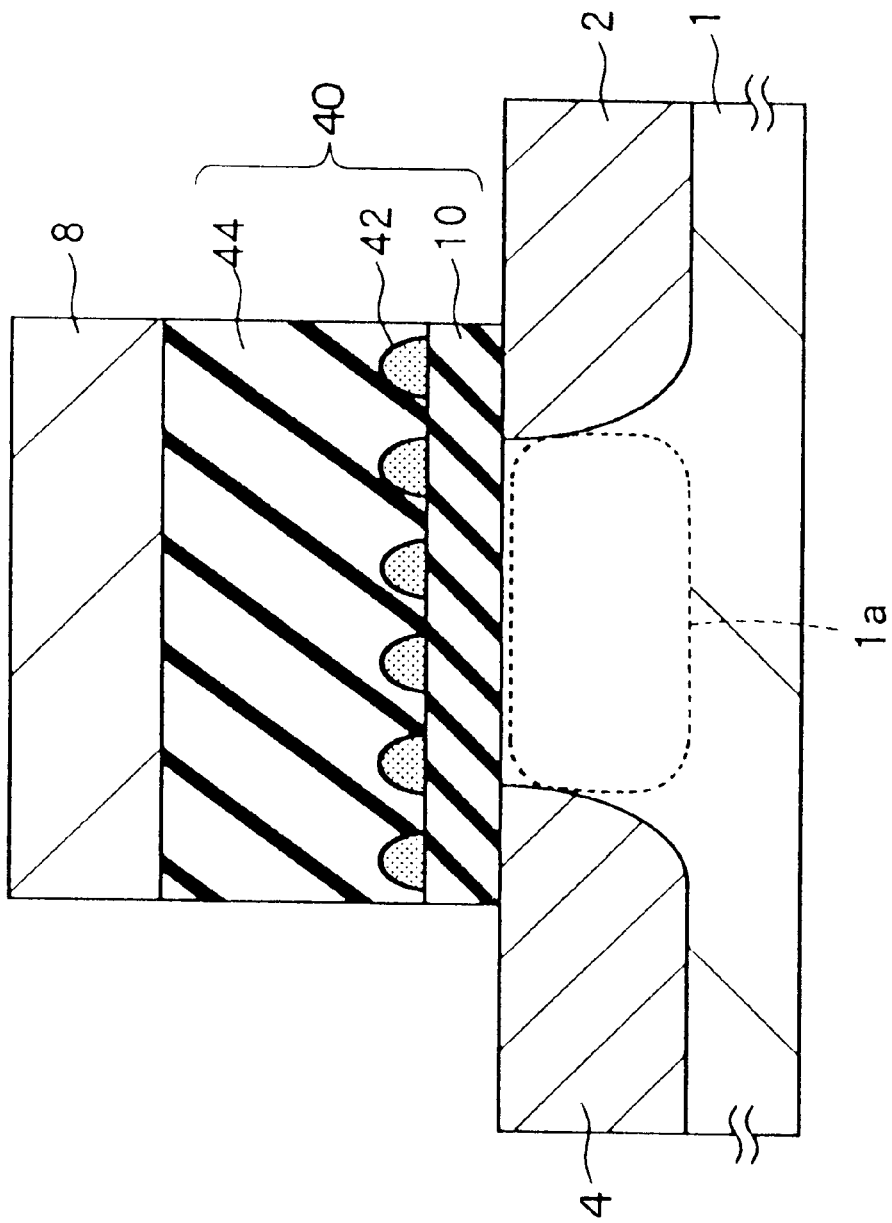
FIG. 20 is a sectional view of the element structure of a silicon nano-crystal (Si nano-crystal) type memory transistor according to a third embodiment of the present invention.

FIG. 20 is a sectional view of the configuration of an Si nano-crystal type memory transistor.

The Si nano-crystal type nonvolatile memory of the third embodiment is similar to the nonvolatile semiconductor memory device of the first embodiment described by referring to FIG. 1. The difference from the first embodiment resides in that the gate insulating film 40 of the third embodiment is formed in place of the nitride film 12 and the top oxide film 14 illustrated in FIG. 1 and in that Si nanocrystals 42 functioning as the charge storing means on the tunnel insulating film 10 and an oxide film 44 lying on them are formed between the tunnel insulating film 10 and the gate electrode 8. The rest of the structure, that is, the semiconductor substrate 1, source region 2, drain region 4, channel forming region 1a, tunnel insulating film 10, and gate electrode 8, are similar to those of the first embodiment. Note that in the third embodiment as well, in the same way as the second embodiment, the tunnel insulating film 10 does not have the oxynitride layer 10a (FIG. 1) on the surface, but as this can be omitted also in the first embodiment, it is not a characteristic feature of the third embodiment.

The Si nano-crystals 42 have a size (diameter) of for example about 4.0 nm. Individual Si nano-crystals are separated spatially by the oxide film 44 at intervals of for example about 4 nm. The tunnel insulating film 10 in the present example is slightly thicker than that of the first embodiment since the charge storing means (Si nanocrystal 42) is near the substrate side, so the thickness can be appropriately selected within a range of from 2.6 nm to 4.0 nm according to the purpose of use. Here, the thickness was set to about 3.2 nm.

In the manufacture of a memory transistor having such a structure, after the formation of the tunnel insulating film 10, a plurality of Si nano-crystals 42 are formed on the tunnel insulating film 10 by for example the reduced pressure CVD process. Further, the Si nano-crystals 42 are buried and the oxide film 44 is formed to for example 7 nm by low pressure CVD. In this low pressure CVD, the material gas is a gas mixture of DCS and $N_2O$ and the substrate temperature is about 700° C. At this time, the Si nano-crystals 42 are embedded in the oxide film 44, and the surface of the oxide film 44 is flattened. Where the flattening is insufficient, a flattening process (for example CMP process) may be newly carried out. Thereafter, after the formation of the gate electrode material, formation of the electrodes, etc., the Si nano-crystal type memory transistor is completed.

The Si nano-crystals 42 formed in this way act as a planarly dispersed carrier trap. The trap level thereof can be estimated from the discontinuity of the energy band with the peripheral silicon oxide. It is estimated to be for example about 3.2 eV. The individual Si nano-crystals 42 of this size can hold several injected electrons. Note that, it is also possible to make the Si nano-crystals 42 further smaller to make them hold single electrons.

The circuit structure of the first embodiment shown in FIG. 2 may be applied as it is in the third embodiment as well. At the time of a write operation, in the same way as the first embodiment, for example, a positive bias voltage is given to the non-selected word line and for example a reverse bias voltage of the reverse bias polarity for the channel forming region is given to the source and drain regions to reduce write and/or erase disturb of a non-selected cell.

The inventors first examined the Si nano-crystal type nonvolatile memory of such a configuration for the data retention characteristic by the back tunneling model of Lundkvist. In order to improve the data retention characteristic, it becomes important to make the trap level deep and enlarge the distance between the charge center and the channel forming region. Therefore, the inventors performed simulation using the Lundkvist model as a physical model to examine the data retention characteristic where the trap level is 3.1 eV. As a result, they found that a good data retention characteristic was exhibited even in the case where the distance from the charge storing medium to the channel forming region 1a is a relatively close 3.2 nm by using deep carrier trap of a trap level of 3.1 eV.

Next, the inventors investigated the low voltage programming in a write and erase operation as another important characteristic. The writing time in the present example was 1 msec or less when the programming voltage had a low programming voltage of 5 V, so a high speed write property of the Si nano-crystal type could be proved.

The inventors then investigated the programming disturb characteristic of the non-selected cells A and B.

First, they investigated the gate length dependency of the optimum range of the inhibit S/D voltage. While FIG. 3 of the first embodiment cannot be applied as it is, a substantially identical result as that by the first embodiment was obtained. Namely, the upper limit of the allowable range of the inhibit S/D voltage is increased to substantially 7.5 V or more in all gate length regions. By this, an increase of the allowable inhibit voltage margin in a 0.18 µm on below generation Si nano-crystal type nonvolatile memory was achieved.

Further, inventors found the intensity of the distribution of the electric field in the channel vertical direction by two-dimensional device simulation. While FIG. 4 of the first embodiment cannot be applied as it is, they obtained similar evidence as that in the first embodiment as to the reason why the application of for example a positive bias voltage to the non-selected word line was very effective in the third embodiment as well, particularly when the gate length was 0.2 µm or less.

Further, while the graph of the gate length dependency of the inhibit gate voltage of the non-selected cell C shown in FIG. 7 cannot be applied as it is to the third embodiment, there is the same tendency that the inhibit gate voltage slightly increases in the short gate length region.

Next, the inventors investigated the voltage tolerance of the memory transistor.

While the graphs of FIG. 13 and FIG. 14 showing the result of the investigation of the voltage tolerance in the first embodiment cannot be applied as they are to the third embodiment, since the method of the memory transistor was the same, the fact that the breakdown voltage of the S/D junction was 10 V and did not depend upon the write state and the erase state and so on were the same as that of the first embodiment.

Next, for the principal device characteristics, while FIG. 15 and FIG. 16 in the first embodiment cannot be applied as they are, in the third embodiment as well, good results equivalent to the first embodiment were obtained not only for the endurance characteristic and data retention characteristic, but also the read disturb characteristic etc.

The Si nano-crystal type nonvolatile memory according to the third embodiment exhibits a similar effect to that of the first embodiment. Namely, by applying for example a positive bias voltage to the non-selected word line, the upper limit of the inhibit S/D voltage of the non-selected cell B is increased and, as a result, the allowable inhibit voltage margin of the non-selected cells A and B can be increased. This effect is particularly conspicuous in the region where the gate length is shorter than 0.2 µm and is achieved by the possibility of reduction of the electric field in the channel vertical direction increased by the channel depletion by the application of the gate bias voltage. Further, such a bias setting will not reduce the voltage tolerance of the transistor and the principal device characteristics. The realization of a one-transistor cell is facilitated by the improvement of the programming disturb. Various advantages are brought about by this, that is, the reduction of costs due to the reduction of cell area and consequently the reduction of chip area and enlargement of capacity. This enables an improvement of the endurance characteristic.

Further, by controlling the size of the Si nano-crystals to make them uniform, it is also possible to realize a multi-level memory using the quantum effect.

Fourth Embodiment

As a fourth embodiment of the present invention, a nonvolatile semiconductor memory device using a large number of fine division type floating gates embedded in the insulating film and insulated and isolated from each other as the charge storing means of the memory transistor (hereinafter referred to as a fine division FG type) is shown.

Figure 21:
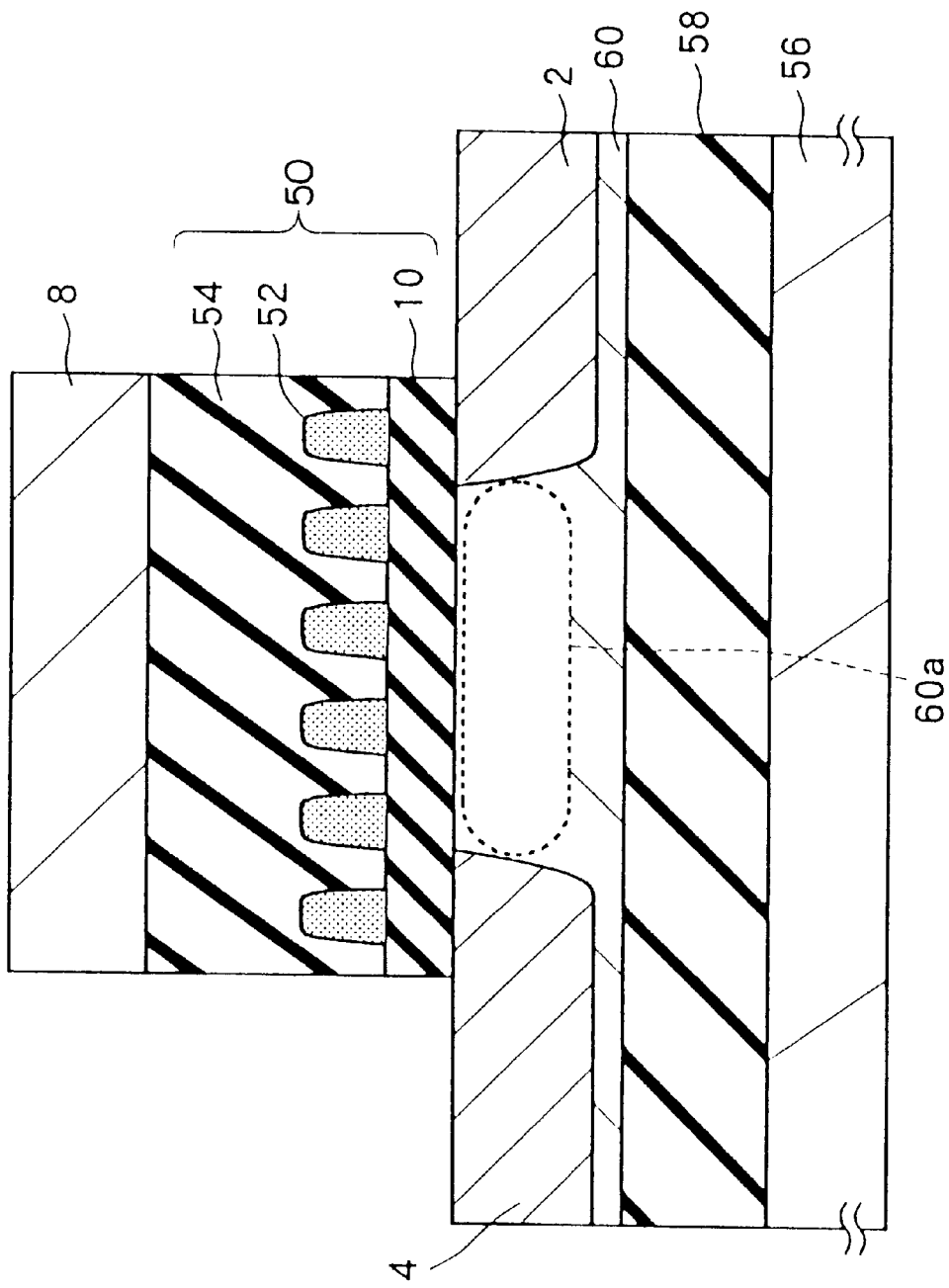
FIG. 21 is a sectional view of the element structure of the fine division FG type memory transistor according to a fourth embodiment of the present invention.

FIG. 21 is a sectional view of the structure of this fine division FG type memory transistor. The difference of structure between the fine division FG type nonvolatile memory of the fourth embodiment and the nonvolatile semiconductor memory device of the first embodiment will be described first. The difference from the first embodiment resides in the fact that the memory transistor is formed on an SOI substrate, a gate insulating film 50 of the fourth embodiment is formed in place of the nitride film 12 and the top oxide film 14, and fine division type floating gates 52 functioning as the charge storing means on the tunnel insulating film 10 and an oxide film 54 lying on this are formed between the tunnel insulating film 10 and the gate electrode 8. In the rest of the structures, the tunnel insulating film 10 and the gate electrode 8 are similar to those of the first embodiment. Note that the tunnel insulating film 10 in the fourth embodiment does not have the oxynitride layer 10a (FIG. 1) on the surface, but since this can also be omitted in the first embodiment, it is not a characteristic feature of the fourth embodiment. This fine division floating gate 52 is a specific example of the "small diameter conductor" referred to in the present invention together with the Si nano-crystal 42 of the previous third embodiment.

As the SOI substrate, use is made of a separation-by-implanted oxygen (SIMOX) substrate in which oxygen ions are implanted into the silicon substrate with a high concentration and an oxide film is formed on the deep side of the substrate, a bonded substrate obtained by forming an oxide film on the surface of one silicon substrate and bonding this to another substrate, etc. The SOI substrate formed by such a method and shown in FIG. 21 is constituted by a semiconductor substrate 56, a separation oxide film 58, and a silicon layer 60. A channel forming region 60a, source region 2, and drain region 4 are provided in the silicon layer 60.

The fine division floating gate 52 is obtained in by processing a usual FG type floating gate to a fine poly-Si dot having a height of for example about 5.0 nm and a diameter of for example up to 8 nm. The tunnel insulating film 10 in the present example is slightly thicker than that of the first embodiment, but is formed much thinner in comparison with the usual FG type. The thickness can be appropriately selected within the range of from 2.5 nm to 4.0 nm in accordance with the purpose of use. Here, the thickness was set to the thinnest 2.5 nm.

In the manufacture of a memory transistor having the structure of the fourth embodiment, after forming the tunnel insulating film 10 on the SOI substrate, a polycrystalline silicon film (final thickness: 7 nm) is formed on the tunnel insulating film 10 by for example the low pressure CVD process. In this reduced pressure CVD, the material gas is DCS and the substrate temperature is for example 600° C. Next, by using for example an electron beam exposure process, the polycrystalline silicon film is processed to a fine Si dot having a diameter of as small as for example 8 nm. This poly-Si dot acts as the fine division type floating gate 52 (charge storing means). Thereafter, the fine division type floating gate 52 is buried by an oxide film 54 formed to for example about 9 nm by reduced pressure CVD. In this reduced pressure CVD, a gas mixture of DCS and $N_2O$ is used as the material gas, and the substrate temperature is set to for example 700° C. At this time, the fine division type floating gate 52 is buried in the oxide film 54, and the surface of the oxide film 54 is flattened. When the flattening is insufficient, preferably a flattening process (for example CMP process) is newly carried out. Thereafter, after the formation of the gate electrode material, the formation of the electrodes, etc., the fine division FG type memory transistor is completed.

The inventors used an SOI substrate to produce a prototype of a device with finely divided floating gates and evaluated its characteristics. As a result, they confirmed that good characteristics as expected could be obtained.

The circuit structure of the first embodiment shown in FIG. 2 is applied as it is in the fourth embodiment as well. When performing a write operation similar to that in the first embodiment, for example a positive bias voltage and for example a positive bias voltage are given to the non-selected cell to reduce write and/or erase disturb.

The inventors investigated the fine division FG type nonvolatile memory having such a structure first for the program disturb characteristic of the non-selected cells A and B.

First, they investigated the gate length dependency of the allowable range of the inhibit S/D voltage. While FIG. 3 of the first embodiment could not be applied as it was, an effect substantially identical to that of the first embodiment could be obtained. Namely, they could confirm that the upper limit of the allowable range of the inhibit S/D voltage was increased to substantially 7.5 V or more in all gate length regions and that, by this, the allowable inhibit voltage margin required for the fine division FG type transistor in a 0.18 μm or below generation SOI element-isolated structure memory transistor array was sufficiently secured.

Further, they found the intensity of distribution of the electric field in the channel vertical direction by two-dimensional device simulation and, while FIG. 4 of the first embodiment could not be applied as it was, obtained similar evidence as that of the first embodiment for the reason why use the application of for example a positive bias voltage to the non-selected word line was very effective particularly when the gate length was 0.2 μm or less in the fourth embodiment as well.

Further, while the graph of the gate length dependency of the inhibit gate voltage of the non-selected cell C shown in FIG. 7 cannot be applied as it is to the present example, the tendency of a slight increase of the inhibit gate voltage in the short gate length region was the same. On the other hand, the voltage which can be supplied to the non-selected word line tended to slightly increase as the gate length became shorter. This indicates in principle that for example a positive bias can be applied to the non-selected word line in a fine division FG type transistor in a 0.18 μm or below generation SOI element-isolated structure memory transistor array.

Next, the inventors investigated the voltage tolerance of the memory transistor.

While the graphs of FIG. 13 and FIG. 14 showing the results of investigation of the voltage tolerance in the first embodiment cannot be applied as they are to the present example, since the method of the memory transistor was the same, the fact that the breakdown voltage of the S/D junction was 10 V and did not depend upon the write state and the erase state in the fourth embodiment was similar to that of the first embodiment.

Next, regarding the principal device characteristics, while the results illustrated in FIG. 15 and FIG. 16 of the first embodiment cannot be applied as they are in the fourth embodiment, good equivalent or better results as those of the first embodiment were obtained for not only the endurance characteristic and data retention characteristic, but also the read disturb characteristic etc.

The fine division FG type nonvolatile memory according to the fourth embodiment exhibits a similar effect to that of the first embodiment. Namely, by applying a positive bias voltage to the non-selected word line, the upper limit of the inhibit S/D voltage of the non-selected cell B is increased and, as a result, the allowable inhibit voltage margin of the non-selected cells A and B can be increased. This effect is particularly conspicuous in the region where the gate length is shorter than 0.2 μm and is achieved by the possibility of reduction of the electric field component in the channel vertical direction increased by the channel depletion when the gate electrode is unbiased by the application of for example a positive bias. Further, such a bias setting will not reduce the voltage tolerance of the transistor and the principal device characteristics. The realization of a one-transistor cell is facilitated by the improvement of the program disturb. Various advantages by this, that is, the reduction of costs due to the reduction of cell area and consequently the reduction of chip area and enlargement of capacity, can be achieved. This enables an improvement of the endurance characteristic.

Further, by controlling the size of the fine division floating gates to be uniform, it is also possible to realize a multi-level memory using the quantum effect.

Note that, also in the FG type nonvolatile memory, there is a known technique of supplying a bias voltage to the non-selected word line and non-selected source line and non-selected bit line at the time of programming, but this is much different from the present invention as described throughout the first to fourth embodiments. Summarizing the key points, the following may be said:

(1) In a write and erase type FG type using full channel FN tunneling, the write voltage of the transistor is a high 20 V, therefore the inhibit S/D voltage becomes 7 to 8 V which is high in comparison with the inhibit voltage of 4 to 5 V of the MONOS type or the like. Namely, the voltage to be supplied to the non-selected word line and the non-selected source line and bit line becomes about 10 V in the FG type, so becomes considerably larger than that of the MONOS type.

(2) The gate length dependency of the inhibit S/D voltage is different in the FG type and the MONOS type. The inhibit S/D voltage margin becomes more severe in the MONOS type having a shorter gate length, but conversely becomes more severe in the FG type having a longer gate length. Accordingly, as described above, the technique of the present invention and the technique applied to the FG type are different in principle.

(3) In the FG type, the voltage of the non-selected word line is set to be the same as or slightly higher than the voltage of the non-selected source line and the non-selected bit line in the non-selected cell B. Conversely, in the MONOS type etc., the voltage of the non-selected word line is set lower.

Various embodiments of the present invention were described above, but the present invention is not limited to the above embodiments. Various modifications can be adopted other than them.

While various embodiments of the present invention were described above, when considering above embodiments all together, it can be said that by the nonvolatile semiconductor memory device according to the present invention, by applying a voltage of a reverse bias polarity for the channel forming region to the non-selected word line, the upper limit of the inhibit S/D voltage of the non-selected cell connected to both of the non-selected word line and the non-selected bit line is increased and the allowable inhibit voltage margin can be enlarged. This effect of improvement of the disturb characteristics is particularly conspicuous in the region where the gate length is shorter than 0.2 μm.

In the present invention, increase the upper limit of this inhibit S/D voltage can improve the allowable inhibit voltage margin of the non-selected cell connected to the same non-selected bit line. This means in turn that the program disturb characteristic, particularly, the margin of the inhibit S/D voltage, can be sufficiently obtained even if the programming voltage is increased from for example usual 10 V to 12 V. As a result, an increase of the write speed (for example 100 times) becomes possible.

By such an improvement of the program disturb characteristics according to the present invention, realization of a one-transistor cell, that is, a memory cell using a single transistor, is facilitated. For realization of such a cell, in addition to the increase of the allowable inhibit voltage margin, it is necessary to adopt an enhancement type memory cell where the threshold voltage of the memory transistor is not depleted, but the tunnel insulating film can be made thicker assuming the same programming speed due to the fact that there is greater leeway for increasing the programming voltage. Due to this, in the erase characteristic, there is little depletion of the threshold voltage. Further, a memory characteristic saturated by the enhancement is obtained. Therefore, in this respect as well, it became possible to easily realize a one-transistor cell.

In the one-transistor cell which can be realized by the present invention, it is not necessary to provide a selection transistor for every memory cell, so it is possible to achieve a reduction of costs due to the reduction of cell area and consequently a reduction of chip area and enlargement of capacity. As a result, it became possible to realize large capacity MONOS type or other nonvolatile memory having a cell area equivalent to that of the NOR type, AND type, NAND type, or DINOR type of FG type nonvolatile memory at a low costs.

Further, in the present invention, when the tunnel insulating film is made relatively thicker, the injection of holes into the charge storing means is suppressed, so the deterioration of the tunnel insulating film due to the holes is suppressed and improvement of the repeated write and erase characteristic (endurance characteristic) becomes possible.

From the above, the present invention provides a nonvolatile semiconductor memory device having a plurality of nonvolatile memory transistors with planarly dispersed charge storing means wherein the programming disturb characteristics is improved and, as a result, realization of a one-transistor cell having a small cell area and low cost becomes easy without sacrificing the voltage tolerance and device characteristics and realization of a nonvolatile semiconductor memory device of a high speed, large capacity, and low cost becomes possible.

What is claimed is:

1. A nonvolatile semiconductor memory device comprising a plurality of memory elements formed in the vicinity of the surface of a substrate, a plurality of word lines for driving the memory elements, and a plurality of bit lines, each of said plurality of memory elements including:
   a semiconductor channel forming region formed in the vicinity of the surface of the substrate,
   a source region in contact with the channel forming region in the vicinity of the surface of the substrate,
   a drain region in contact with the channel forming region at a position facing the source region in the vicinity of the surface of the substrate,
   a gate insulating film including a tunnel insulating film formed on the channel forming region,
   a conductive gate electrode formed on the gate insulating film, and
   a charge storing means which is provided on the tunnel insulating film and in the gate insulating film and is planarly discrete to the other neighboring charge storing means in the gate insulating film;
   the gate electrodes of the plurality of memory elements being respectively connected to the plurality of word lines;
   the source region or the drain region of each of the memory elements being connected to a common line in the bit direction electrically insulated from each of the plurality of word lines and intersecting the word lines; and
   said memory device further comprising:
   a write inhibit voltage applying means for applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region; and
   a non-selected word line biasing means for applying a voltage to a non-selected word line in the polarity of the reverse bias state to the channel forming region when writing data and biasing the gate electrode to the channel forming region to a value less than the write inhibit voltage.

2. A nonvolatile semiconductor memory device as set forth in claim 1, wherein the write inhibit voltage applying means supplies the reverse bias voltage to the source region and/or drain region so as to bias it to a voltage where the memory element connected to the selected word line will not be erroneously written and/or erased.

3. A nonvolatile semiconductor memory device as set forth in claim 1, wherein the non-selected word line biasing means biases the non-selected word line in the polarity becoming a reverse bias state to the channel forming region to a voltage where the memory element connected to the non-selected word line will not be erroneously written and/or erased.

4. A nonvolatile semiconductor memory device as set forth in claim 1, wherein the absolute value of at least the reverse bias voltage supplied to the drain region is larger than the absolute value of the voltage supplied by the non-selected word line biasing means.

5. A nonvolatile semiconductor memory device as set forth in claim 1, wherein the write inhibit voltage applying means applies an identical reverse bias voltage to both of the source region and the drain region.

6. A nonvolatile semiconductor memory device as set forth in claim 5, wherein the absolute value of the reverse bias voltage common to the source region and the drain region is larger than the absolute value of the voltage applied to the non-selected word line.

7. A nonvolatile semiconductor memory device as set forth in claim 1, wherein in the memory element, depletion layers extend from the source region of the memory element and the drain region of the memory element to the channel forming region where they merge when the reverse bias voltage is applied in a state where the gate electrode of the memory element is at the same potential as the channel forming region.

8. A nonvolatile semiconductor memory device as set forth in claim 1, wherein the gate length of the memory element is shorter than the gate length when the reverse bias voltage is applied in a state where the gate electrode of the memory element is in the same potential as the channel forming region of the memory element and depletion layers extend from the source region of the memory element and the drain region of the memory element to the channel forming region of the memory element and they just merge.

9. A nonvolatile semiconductor memory device as set forth in claim 1, wherein the gate length of a memory element is not more than 0.2 µm.

10. A nonvolatile semiconductor memory device as set forth in claim 1, wherein the nonvolatile memory device comprises:
source lines commonly connecting the source regions in the bit line direction and supplied with the reverse bias voltage,
bit lines commonly connecting the drain regions in the bit line direction and supplied with the reverse bias voltage, and
word lines commonly connecting the gate electrodes in the word line direction and supplied with a voltage in the polarity becoming a reverse bias state to the channel forming regions;
the write inhibit voltage supplying means connected to the source lines and the bit lines; and
the non-selected word line biasing means connected to non-selected word lines.

11. A nonvolatile semiconductor memory device as set forth in claim 10, wherein:
each of the source lines comprises a sub-source line to which the source region is connected and a main source line;
each of the bit lines comprises a sub-bit line to which the drain region is connected and a main bit line;
the memory device further comprises selection transistors, each of the transistors being positioned between the sub-source line and the main source line and between the sub-bit line and the main bit line; and
the reverse bias voltage supplied through the selection transistor from the main bit line side.

12. A nonvolatile semiconductor memory device as set forth in claim 1, further comprising a plurality of bit direction line shaped element isolation regions arranged at predetermined intervals from each other in the surface of the substrate and
the common line being arranged in a detouring manner on the element isolation regions so as to be connected on one of the source regions or drain regions and to avoid the other of the source regions or drain regions.

13. A nonvolatile semiconductor memory device as set forth in claim 12, wherein:
the plurality of element isolation regions form parallel stripes in shape;
the source regions and drain regions are formed with contact holes self-aligned by side wall insulating layers formed on side walls of the word lines; and
a common line arranged in a detouring manner over the element isolation regions is meander placed while commonly connecting the one regions.

14. A nonvolatile semiconductor memory device as set forth in claim 1, wherein the charge storing means does not have conductivity as an overall plane facing the channel forming region at least when there is no movement of charge to or from the charge storing means.

15. A nonvolatile semiconductor memory device as set forth in claim 14, wherein the gate insulating film includes a tunnel insulating film on the channel forming layer and a nitride film formed on the tunnel insulating film.

16. A nonvolatile semiconductor memory device as set forth in claim 15, wherein the gate insulating film includes a top oxide film positioned between the nitride film and the gate electrode.

17. A nonvolatile semiconductor memory device as set forth in claim 14, wherein the gate insulating film includes a tunnel insulating film on the channel forming region and an oxynitride film formed on the tunnel insulating film.

18. A nonvolatile semiconductor memory device as set forth in claim 17, wherein the gate insulating film includes a top oxide film positioned between the oxynitride film and the gate electrode.

19. A nonvolatile semiconductor memory device as set forth in claim 14, wherein the gate insulating film includes a tunnel insulating film on the channel forming layer and, as the charge storing means, small particle size semiconductor or conductors formed on the tunnel insulating film and mutually insulated from each other, the particle size less than 10 nanometeres.

20. A nonvolatile semiconductor memory device as set forth in claim 19, wherein the gate insulating film includes an oxide film including the small particle size semiconductors or conductors.

21. A nonvolatile semiconductor memory device as set forth in claim 20, wherein the gate insulating film includes a top oxide film positioned between the oxide film and the gate electrode.

22. A nonvolatile semiconductor memory device as set forth in claim 14, wherein the gate insulating film includes a tunnel insulating film on the channel forming region and a finely divided floating gate formed on the tunnel insulating film as the charge storing means.

23. A nonvolatile semiconductor memory device as set forth in claim 22, wherein the gate insulating film includes an oxide film including the finely divided floating gate.

24. A nonvolatile semiconductor memory device as set forth in claim 23, wherein the gate insulating film includes a top oxide film positioned between the oxide film and the gate electrode.

25. A writing method in a nonvolatile semiconductor memory device in which a plurality of memory elements formed in the vicinity of the surface of a substrate are arranged in a word line direction and a bit line direction, each of the plurality of memory elements in the nonvolatile semiconductor memory device comprising: a semiconductor channel forming region formed in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film including a tunnel insulating film formed on the channel forming region, a conductive gate electrode formed on the gate insulating film, and a charge storing means which is provided on the tunnel insulating film and in the gate insulating film and is planarly discrete to the other neighboring charge storing means in the gate insulating film; the gate electrodes of the plurality of memory elements being respectively connected to the plurality of word lines; and the source region or the drain region of each of the memory elements being connected to a common line in the bit direction electrically insulated from each of the word lines and intersecting the word lines;

the writing method in the nonvolatile semiconductor memory device including the steps of:

applying a voltage to a non-selected word line in the polarity by which the non-selected word line becomes in a reverse bias state to the channel forming region when writing data; and applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region to thereby reduce write and/or erase inhibit disturb with respect to the non-selected memory element wherein the absolute value of at least the reverse bias voltage applied to the drain region is higher than the absolute value of the voltage supplied to the non-selected word line.

26. A writing method in a nonvolatile semiconductor memory device as set forth in claim 25, wherein said reverse bias voltage to the source region and/or drain region is a voltage where the memory element connected to the selected word line will not be erroneously written and/or erroneously erased.

27. A writing method in a nonvolatile semiconductor memory device as set forth in claim 25, wherein said voltage of the non-selected word line in the polarity becoming the non-selected word line in a reverse bias state to the channel forming region, is a voltage where the memory element connected to the non-selected word line will not be erroneously written and/or erroneously erased.

28. A writing method in a nonvolatile semiconductor memory device as set forth in claim 25, wherein said voltage of the non-selected gate electrode is not more than an inhibit voltage to the source and/or drain region.

29. A writing method in a nonvolatile semiconductor memory device as set forth in claim 25, wherein when supplying the reverse bias voltage, the same voltage is supplied to both of the source region and the drain region.

30. A writing method in a nonvolatile semiconductor memory device as set forth in claim 25, wherein the absolute value of the reverse bias voltage common to the source region and the drain region is higher than the absolute value of the voltage supplied to the non-selected word line.

31. A writing method in a nonvolatile semiconductor memory device as set forth in claim 25, wherein in the memory element, depletion layers extend from the source region and the drain region to the channel forming region where they merge when the reverse bias voltage is supplied in a state where the gate electrode is in the same potential as the channel forming region.

32. A writing method in a nonvolatile semiconductor memory device as set forth in claim 25, wherein the gate length of the memory element is shorter than the gate length when the reverse bias voltage is supplied in a state where the gate electrode of the memory element is in the same potential as the channel forming region and depletion layers extend from the source region and the drain region to the channel forming region and they just merge.

33. A writing method in a nonvolatile semiconductor memory device as set forth in claim 25, wherein the gate length of a memory element is not more than 0.2 $\mu$m.

34. A writing method in a nonvolatile semiconductor memory device as set forth in claim 25, wherein:

the nonvolatile memory device comprises:

source lines commonly connecting the source regions in the bit line direction, bit lines commonly connecting the drain regions in the bit line direction, and word lines commonly connecting the gate electrodes in the word line direction;

the reverse bias voltage supplied through the source lines and/or the bit lines; and the voltage in a direction becoming a reverse bias to the channel forming regions supplied through the word lines.

35. A writing method in a nonvolatile semiconductor memory device as set forth in claim 34, wherein:

each of the source lines comprises a sub source line to which the source region is connected and a main source line;

each of the bit lines comprises a sub bit line to which the drain region is connected and a main bit line;

the memory device further comprises selection transistors between the sub-source line and main source line and between the sub bit line and main bit line; and the reverse bias voltage is supplied through the selection transistor from the main bit line side.

36. A writing method in a nonvolatile semiconductor memory device as set forth in claim 34, wherein:

the nonvolatile semiconductor memory device comprises a plurality of bit line direction shaped element isolation regions formed at intervals from each other in the surface of the substrate and the common line is arranged in a detouring manner on the element isolation regions so as to be connected to one of the source regions and drain regions and avoid the other regions.

37. A writing method in a nonvolatile semiconductor memory device as set forth in claim 36, wherein:

the plurality of element isolation regions form parallel stripes in shape;

the source regions and drain regions are formed with contact holes self-aligned by side wall insulating layers formed on side walls of the word lines; and the common line arranged in a detouring manner over the element isolation regions is meander placed while commonly connecting the one regions.

38. A writing method in a nonvolatile semiconductor memory device as set forth in claim 25 wherein the charge storing means does not have conductivity as an overall plane facing the channel forming region at least when there is no movement of charge to or from the charge storing means.

39. A writing method in a nonvolatile semiconductor memory device as set forth in claim 38, wherein the gate insulating film includes a tunnel insulating film on the channel forming region and a nitride film formed on the tunnel insulating film.

40. A writing method in a nonvolatile semiconductor memory device as set forth in claim 38, wherein the gate insulating film includes a tunnel insulating film on the channel forming region and an oxynitride film formed on the tunnel insulating film.

41. A writing method in a nonvolatile semiconductor memory device as set forth in claim 38, wherein the gate insulating film includes a tunnel insulating film on the channel forming layer and, as the charge storing means, small particle size semiconductor or conductors formed on the tunnel insulating film and mutually insulated from each other, the particle size less than 10 nanometers.

42. A writing method in a nonvolatile semiconductor memory device as set forth in claim 38, wherein the gate insulating film includes a tunnel insulating film on the channel forming region and a finely divided floating gate formed on the tunnel insulating film as the charge storing means.

43. A writing method in a nonvolatile semiconductor memory device as set forth in claim 25, further including the steps of:

supplying the non-selected word line with a voltage becoming the non-selected word line in the back bias state;

supplying the source region and/or drain region of the memory element connected to the selected word line with the back bias voltage through the common line; and supplying the selected word line with a programming voltage.

44. A nonvolatile semiconductor memory device comprising a plurality of memory elements formed in the vicinity of the surface of a substrate, a plurality of word lines for driving the memory elements, and a plurality of bit lines, each of said plurality of memory elements including:

a semiconductor channel forming region formed in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film including a tunnel insulating film formed on the channel forming region, a conductive gate electrode formed on the gate insulating film, and a charge storing means which is provided on the tunnel insulating film and in the gate insulating film and is planarly discrete to the other neighboring charge storing means in the gate insulating film;

the gate electrodes of the plurality of memory elements being respectively connected to the plurality of word lines;

the source region or the drain region of each of the memory elements being connected to a common line in the bit direction electrically insulated from each of the plurality of word lines and intersecting the word lines;

a plurality of bit direction line shaped element isolation regions arranged at predetermined intervals from each other in the surface of the substrate;

the common line being arranged in a detouring manner over the element isolation regions so as to be connected on one of the source regions or drain regions and to avoid the other of the source regions or drain regions; and said memory device further comprising:

a write inhibit voltage applying means for applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region; and a non-selected word line biasing means for applying a voltage to a non-selected word line in the polarity of the reverse bias state to the channel forming region when writing data.

45. A nonvolatile semiconductor memory device as set forth in claim 44, wherein:

the plurality of element isolation regions form parallel stripes in shape;

the source regions and drain regions are formed with contact holes self-aligned by side wall insulating layers formed on side walls of the word line; and a common line arranged in a detouring manner over the element isolation regions is meander placed while commonly connecting the one regions.

46. A writing method in a nonvolatile semiconductor memory device in which a plurality of memory elements formed in the vicinity of the surface of a substrate are arranged in a word line direction and a bit line direction, each of the plurality of memory elements in the nonvolatile semiconductor memory device comprising: a semiconductor channel forming region formed in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film including a tunnel insulating film formed on the channel forming region, a conductive gate electrode formed on the gate insulating film, and a charge storing means which is provided on the tunnel insulating film and in the gate insulating film and is planarly discrete to the other neighboring charge storing means in the gate insulating film; the gate electrodes of the plurality of memory elements being respectively connected to the plurality of word lines; and the source region or the drain region of each of the memory elements being connected to a common line in the bit direction electrically insulated from each of the word lines and intersecting the word lines; the source regions and the drain regions formed with contact holes self-aligned by side wall insulation layers formed on side wall of the word lines; a plurality of bit line direction shaped element isolation regions formed at intervals from each other in the surface of the substrate, the plurality of element isolation regions forming parallel stripes in shape; and the common line arranged in a detouring manner over the element isolation regions so as to be connected to one of the source regions and drain regions and avoid the other regions and the common line arranged being meander placed while commonly connecting the one regions;

the writing method in the nonvolatile semiconductor memory device including the steps of:

applying a voltage to a non-selected word line in the polarity which becomes the non-selected word line in a reverse bias state to the channel forming region when writing data; and applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region to thereby reduce write and/or erase inhibit disturb with respect to the non-selected memory element.

47. A writing method in a nonvolatile semiconductor memory device in which a plurality of memory elements formed in the vicinity of the surface of a substrate are arranged in a word line direction and a bit line direction, each of the plurality of memory elements in the nonvolatile semiconductor memory device comprising: a semiconductor channel forming region formed in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film including a tunnel insulating film formed on the channel forming region, a conductive gate electrode formed on the gate insulating film, and a charge storing means which is provided on the tunnel insulating film and in the gate insulating film and is planarly discrete to the other neighboring charge storing means in the gate insulating film; the gate electrodes of the plurality of memory elements being respectively connected to the plurality of word lines; and the source region or the drain region of each of the memory elements being connected to a common line in the bit direction electrically insulated from each of the word lines and intersecting the word lines; the charge storing means not having conductivity as an overall plane facing the channel forming region at least when there is no movement of charge to or from the charge storing means;

the writing method in the nonvolatile semiconductor memory device including the steps of:

applying a voltage to a non-selected word line in the polarity which becomes the non-selected word line in a reverse bias state to the channel forming region when writing data; and applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region to thereby reduce write and/or erase inhibit disturb with respect to the non-selected memory element.

48. A writing method in a nonvolatile semiconductor memory device as set forth in claim 47, wherein the gate insulating film includes a tunnel insulating film on the channel forming region and a nitride film formed on the tunnel insulating film.

49. A writing method in a nonvolatile semiconductor memory device as set forth in claim 47, wherein the gate insulating film includes a tunnel insulating film on the channel forming region and an oxynitride film formed on the tunnel insulating film.

50. A writing method in a nonvolatile semiconductor memory device as set forth in claim 47, wherein the gate insulating film includes a tunnel insulating film on the channel forming layer and, as the charge storing means, small particle size semiconductor or conductors formed on the tunnel insulating film mutually insulated from each other and having a particle size of less than 10 nanometers.

51. A writing method in a nonvolatile semiconductor memory device as set forth in claim 38, wherein the gate insulating film includes a tunnel insulating film on the channel forming region and a finely divided floating gate formed on the tunnel insulating film as the charge storing means.

52. A writing method in a nonvolatile semiconductor memory device in which a plurality of memory elements formed in the vicinity of the surface of a substrate are arranged in a word line direction and a bit line direction, each of the plurality of memory elements in the nonvolatile semiconductor memory device comprising: a semiconductor channel forming region formed in the vicinity of the surface of the substrate, a source region in contact with the channel forming region in the vicinity of the surface of the substrate, a drain region in contact with the channel forming region at a position facing the source region in the vicinity of the surface of the substrate, a gate insulating film including a tunnel insulating film formed on the channel forming region, a conductive gate electrode formed on the gate insulating film, and a charge storing means which is provided on the tunnel insulating film and in the gate insulating film and is planarly discrete to the other neighboring charge storing means in the gate insulating film; the gate electrodes of the plurality of memory elements being respectively connected to the plurality of word lines; and the source region or the drain region of each of the memory elements being connected to a common line in the bit direction electrically insulated from each of the word lines and intersecting the word lines;

the writing method in the nonvolatile semiconductor memory device including the steps of:

applying a voltage to a non-selected word line in the polarity which becomes the non-selected word line in a reverse bias state to the channel forming region when writing data;

applying a reverse bias voltage via the common line to the source region and/or drain region of the memory element having a gate electrode connected to a word line selected when writing data, the reverse bias voltage being a voltage by which the source region and/or drain region becomes reverse biased relative to the channel forming region to thereby reduce write and/or erase inhibit disturb with respect to the non-selected memory element;

supplying the non-selected word line with a voltage becoming the non-selected word line in the reverse bias state;

supplying the source region and/or drain region of the memory element connected to the selected word line with the reverse bias voltage through the common line; and supplying the selected word line with a programming voltage.

* * * * *